US 9,236,554 B2

(12) United States Patent
Hayasaka et al.

(10) Patent No.: US 9,236,554 B2
(45) Date of Patent: Jan. 12, 2016

(54) PIEZOELECTRIC DEVICE AND METHOD FOR FABRICATING THE SAME

(71) Applicant: NIHON DEMPA KOGYO CO., LTD., Tokyo (JP)

(72) Inventors: Taichi Hayasaka, Saitama (JP); Shuichi Mizusawa, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 356 days.

(21) Appl. No.: 13/802,512

(22) Filed: Mar. 13, 2013

(65) Prior Publication Data

US 2013/0241357 A1    Sep. 19, 2013

(30) Foreign Application Priority Data

Mar. 15, 2012   (JP) ................... 2012-058053

(51) Int. Cl.
| | |
|---|---|
| *H01L 41/29* | (2013.01) |
| *H01L 41/08* | (2006.01) |
| *H03H 9/10* | (2006.01) |
| *H01L 23/00* | (2006.01) |
| *H03H 9/13* | (2006.01) |
| *H03H 3/02* | (2006.01) |
| *H03H 9/05* | (2006.01) |

(52) U.S. Cl.
CPC ............ *H01L 41/0805* (2013.01); *H01L 24/97* (2013.01); *H01L 41/29* (2013.01); *H03H 9/1021* (2013.01); *H03H 9/1035* (2013.01); *H01L 2224/16225* (2013.01); *H03H 9/0547* (2013.01); *H03H 9/131* (2013.01); *H03H 2003/022* (2013.01); *Y10T 29/42* (2015.01)

(58) Field of Classification Search
CPC ... H03H 9/1021; H03H 9/1014; H03H 9/131; H01L 41/047

USPC .................................................. 310/344, 364
See application file for complete search history.

(56) References Cited

U.S. PATENT DOCUMENTS

| | | | | |
|---|---|---|---|---|
| 6,917,142 | B2 * | 7/2005 | Koyama ............... | H03H 9/1021 310/344 |
| 2005/0253263 | A1* | 11/2005 | Sugimoto et al. ............. | 257/737 |
| 2007/0170819 | A1* | 7/2007 | Kuwahara ................ | H03H 3/04 310/344 |
| 2010/0207696 | A1* | 8/2010 | Sayama ............... | H03H 9/1021 331/158 |
| 2011/0309720 | A1* | 12/2011 | Kawahara ............... | H01L 23/10 310/313 R |
| 2012/0176004 | A1* | 7/2012 | Mizusawa ................ | H03H 3/02 310/348 |

FOREIGN PATENT DOCUMENTS

JP        2000-252375        9/2000

* cited by examiner

*Primary Examiner* — Shawki S Ismail
*Assistant Examiner* — Bryan Gordon
(74) *Attorney, Agent, or Firm* — Jianq Chyun IP Office

(57) ABSTRACT

A piezoelectric device includes a piezoelectric vibrating piece, a base plate, and a lid plate. The base plate includes one principal surface where the piezoelectric vibrating piece is placed and includes a connecting electrode electrically connected to the extraction electrode, and another principal surface including a mounting terminal. The lid plate seals the vibrator. The lid plate seals the vibrator. At least a part of the mounting terminal includes a first metal film, a second metal film, and an electroless plating film. The second metal film is formed to cover the first metal film or is formed at a part of a surface of the first metal film. The second metal film has a different area from the first metal film. The electroless plating film is formed at least on a surface of the second metal film by electroless plating.

6 Claims, 15 Drawing Sheets

PIEZOELECTRIC DEVICE AND METHOD FOR FABRICATING THE SAME

CROSS REFERENCE TO RELATED APPLICATIONS

This application claims the priority benefit of Japan application serial no. 2012-058053, filed on Mar. 15, 2012. The entirety of the above-mentioned patent application is hereby incorporated by reference herein and made a part of this specification.

TECHNICAL FIELD

This disclosure relates to a piezoelectric device that includes an electrode formed by electroless plating and a method for fabricating the piezoelectric device.

DESCRIPTION OF THE RELATED ART

A surface mount type piezoelectric device that includes a piezoelectric vibrating piece, which vibrates at a predetermined vibration frequency, is known. Mounting terminals (a hot terminal to be connected to an external electrode or similar member and a grounding terminal that serves as a grounding) are formed on a surface of the piezoelectric device as an electrode. The piezoelectric device is mounted to a printed circuit board or similar member via this mounting terminal. Since the mounting terminal is formed on the surface of the piezoelectric device, the mounting terminal may be detached by heating of a solder or similar cause or may be damaged. Therefore, with the piezoelectric device, a thick film is formed on the mounting terminal by plating or similar method to ensure conduction. Additionally, the thick film formed by plating is also formed as a barrier layer that prevents solder leaching.

For example, Japanese Unexamined Patent Application Publication No. 2000-252375 discloses a mounting terminal formed with a conductive paste and a plating layer formed on a surface of the conductive paste.

However, due to a cause such as contamination of a surface of a foundation layer of a conductive paste or similar member, a plating layer may not be formed.

A need thus exists for a piezoelectric device and a method for fabricating the piezoelectric device which are not susceptible to the drawbacks mentioned above.

SUMMARY

A piezoelectric device according to a first aspect includes a piezoelectric vibrating piece that includes a vibrator with a pair of excitation electrodes and an extraction electrode extracted from the pair of excitation electrodes. The vibrator vibrates at a predetermined vibration frequency. The base plate includes one principal surface and another principal surface. The piezoelectric vibrating piece is placed on the one principal surface. A connecting electrode is formed on the one principal surface and is electrically connected to the extraction electrode. A mounting terminal is formed on the another principal surface. The lid plate seals the vibrator. At least a part of the mounting terminal includes a first metal film, a second metal film, and an electroless plating film. The first metal film includes a plurality of laminated metal layers formed by sputtering or vacuum evaporation. The second metal film includes a plurality of laminated metal layers. The second metal film is formed to cover the first metal film or is formed at a part of a surface of the first metal film. The second metal film has a different area from the first metal film. The electroless plating film is formed at least on a surface of the second metal film by electroless plating.

BRIEF DESCRIPTION OF THE DRAWINGS

The foregoing and additional features and characteristics of this disclosure will become more apparent from the following detailed description considered with the reference to the accompanying drawings, wherein:

FIG. 3C is a partial cross-sectional view of a base plate 120a;

DETAILED DESCRIPTION

The preferred embodiments of this disclosure will be described with reference to the attached drawings. It will be understood that the scope of the disclosure is not limited to the described embodiments, unless otherwise stated.

Constitution of a Piezoelectric Device 100 According to a First Embodiment

Figure 1:
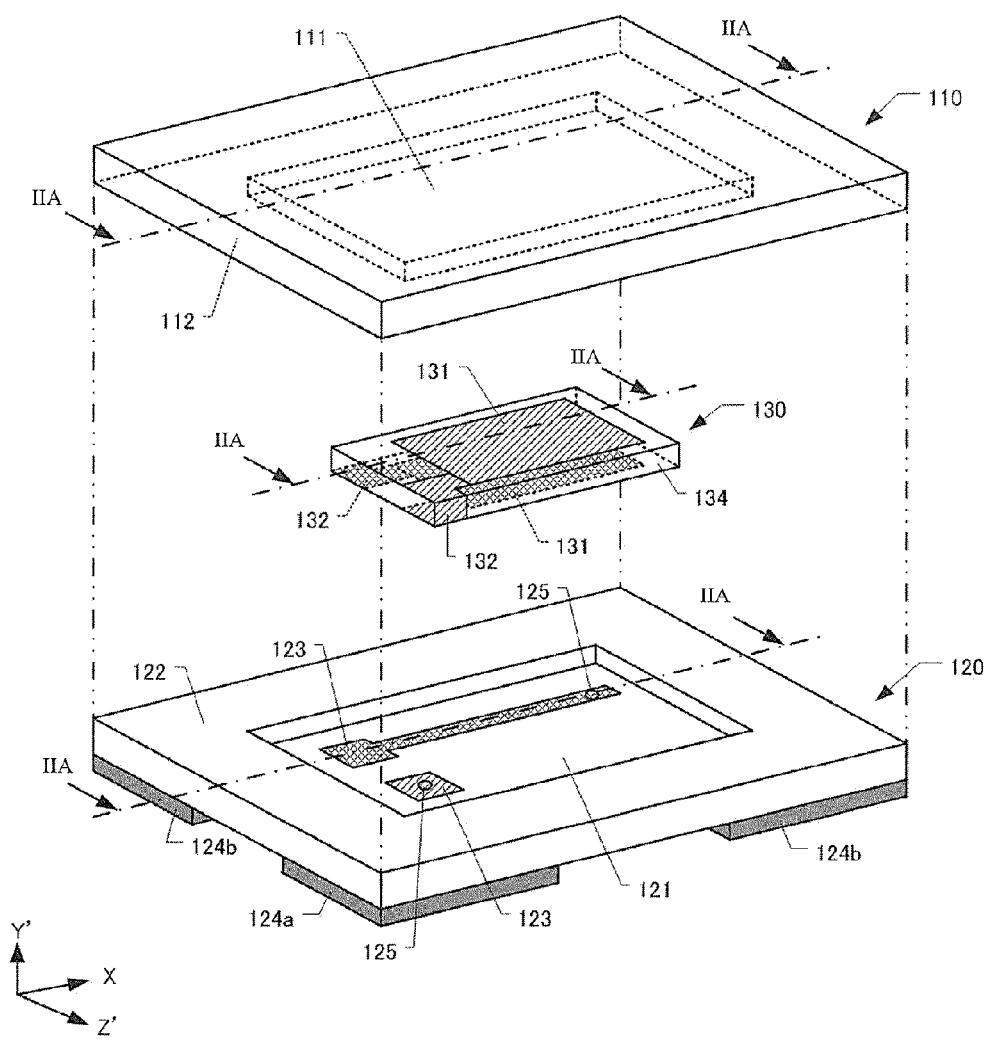
FIG. 1 is an exploded perspective view of a piezoelectric device 100.

FIG. 1 is an exploded perspective view of the piezoelectric device 100. The piezoelectric device 100 includes a lid plate 110, a base plate 120, and a piezoelectric vibrating piece 130. An AT-cut quartz-crystal vibrating piece, for example, is employed for the piezoelectric vibrating piece 130. The AT-cut quartz-crystal vibrating piece has a principal surface (in the Y-Z plane) that is tilted by 35° 15' about the Y-axis of crystallographic axes (XYZ) in the direction from the Z-axis to the Y-axis around the X-axis. In the following description, the new axes tilted with reference to the axis directions of the AT-cut quartz-crystal vibrating piece are denoted as the Y'-axis and the Z'-axis. This disclosure defines the long side direction of the piezoelectric device 100 as the X-axis direction, the height direction of the piezoelectric device 100 as the Y'-axis direction, and the direction perpendicular to the X and Y'-axis directions as the Z'-axis direction.

The piezoelectric vibrating piece 130 includes a vibrator 134, an excitation electrode 131, and an extraction electrode 132. The vibrator 134 vibrates at a predetermined vibration frequency and has a rectangular shape. The excitation electrodes 131 are formed on surfaces at the +Y'-axis side and the −Y'-axis side of the vibrator 134. The extraction electrode 132 is extracted from each excitation electrode 131 to the −X-axis side. The extraction electrode 132 is extracted from the excitation electrode 131, which is formed on the surface at the +Y'-axis side of the vibrator 134. The extraction electrode 132 is extracted from the excitation electrode 131 to the −X-axis side, and is further extracted to the surface at the −Y'-axis side of the vibrator 134 via the side surface at the +Z'-axis side of the vibrator 134. The extraction electrode 132 is extracted from the excitation electrode 131, which is formed on the surface at the −Y'-axis side of the vibrator 134. The extraction electrode 132 is extracted from the excitation electrode 131 to the −X-axis side, and is formed up to the corner at the −X-axis side and the −Z'-axis side of the vibrator 134.

The base plate 120 employs a material such as a crystal and a glass as a base material. An electrode is formed on a surface of this base material. A bonding surface 122 is formed at the peripheral area of the surface at the +Y'-axis side of the base plate 120. The bonding surface 122 is to be bonded to the lid plate 110 via a sealing material 142 (see FIG. 2A). The base plate 120 includes a depressed portion 121 at the center of the surface at the +Y'-axis side. The depressed portion 121 is depressed from the bonding surface 122 in the −Y'-axis direction. The depressed portion 121 includes a pair of connecting electrodes 123. Each connecting electrode 123 electrically connects to an extraction electrode 132 of the piezoelectric vibrating piece 130 via a conductive adhesive 141 (see FIG. 2A). The base plate 120 includes a pair of hot terminals 124a and a pair of grounding terminals 124b on the surface at the −Y'-axis side. The pair of hot terminals 124a and the pair of grounding terminals 124b are mounting terminals to mount the piezoelectric device 100 to a printed circuit board or similar member. The hot terminal 124a is electrically connected to an external electrode or similar member to apply a voltage to the piezoelectric device 100. The grounding terminal 124b is a terminal to ground the piezoelectric device 100. The connecting electrode 123 electrically connects to the hot terminal 124a via a through electrode 125.

The lid plate 110 includes a depressed portion 111 on the surface at the −Y'-axis side. The depressed portion 111 is depressed in the +Y'-axis direction. A bonding surface 112 is formed surrounding the depressed portion 111. The bonding surface 112 is to be bonded to the bonding surface 122 of the base plate 120 via the sealing material 142 (see FIG. 2A).

Figure 2A:
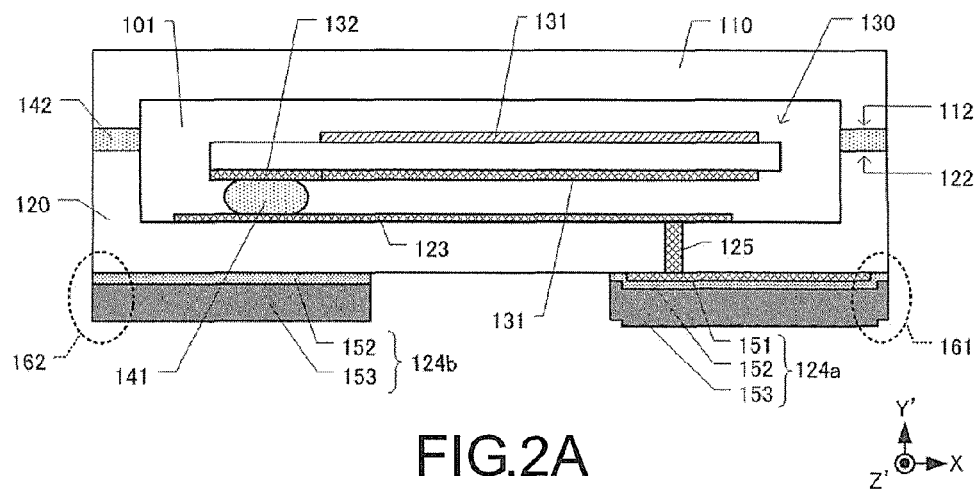
FIG. 2A is a cross-sectional view taken along the line IIA-IIA of FIG. 1.

FIG. 2A is a cross-sectional view taken along the line IIA-IIA of FIG. 1. A sealed cavity 101 is formed in the piezoelectric device 100 by bonding the bonding surface 122 of the base plate 120 and the bonding surface 112 of the lid plate 110 together via the sealing material 142. The cavity 101 houses the piezoelectric vibrating piece 130. The extraction electrode 132 electrically bonds to the connecting electrode 123 of the base plate 120 via the conductive adhesive 141. This electrically connects the excitation electrode 131 to the hot terminal 124a.

The hot terminal 124a is formed by a first metal film 151, a second metal film 152, and an electroless plating film 153. The first metal film 151 is formed on the surface at the −Y'-axis side of the base material of the base plate 120. The second metal film 152 is formed to cover the first metal film 151. The electroless plating film 153 is formed on the surface of the second metal film 152. Further, the grounding terminal 124b is formed by the second metal film 152 and the electroless plating film 153. The second metal film 152 is formed on the surface at the −Y'-axis side of the base material of the base plate 120. The electroless plating 153 is formed on the surface of the second metal film 152.

Figure 2B:
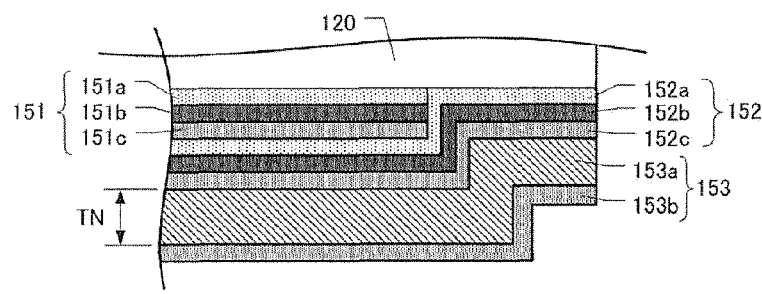
FIG. 2B is an enlarged view of the portion enclosed by a dotted line 161 of FIG. 2A.

FIG. 2B is an enlarged view of the portion enclosed by a dotted line 161 of FIG. 2A. FIG. 2B illustrates an enlarged cross-sectional view of the hot terminal 124a. The first metal film 151 is formed of three layers: a first layer 151a, a second layer 151b, and a third layer 151c. The first layer 151a is a layer made of a chrome (Cr) and is formed on the surface at the −Y'-axis side of the base material of the base plate 120. The chrome (Cr) is employed as a material of the first layer 151a for good adhesion to a material such as a crystal and a glass, which is the base material of the base plate 120. The third layer 151c, which is formed at a surface of the first metal film 151, is made of a gold (Au). Chrome (Cr) adheres well to a material such as a crystal and a glass, but does not stick to solder or similar material. Accordingly, the surface of the first metal film 151 is covered with a gold (Au), which sticks to a solder or similar material well. Further, in the first metal film 151, the second layer 151b is formed between the first layer 151a and the third layer 151c. When heat or the like is applied to the chrome (Cr), which constitutes the first layer 151a, during a fabrication process, the chrome spreads to the gold (Au) layer. This reduces adhesion between the chrome (Cr) and the base plate 120. Further, when the chrome (Cr) spreads to a surface, the chrome (Cr) oxidizes, making formation of the electroless plating film 153 or similar member difficult. Therefore, formation of the second layer 151b prevents spread of the chrome (Cr) to the gold (Au) layer, resulting in prevention of weak bonding between the first metal film 151 and the base plate 120.

The second layer 151b is made of, for example, a nickel tungsten (Ni—W). The second layer 151b may also be made of platinum (Pt). For example, when platinum (Pt) is employed, the first layer 151a is formed to have a thickness of 300 angstroms to 500 angstroms, the second layer 151b is formed to have a thickness of 1000 angstroms to 2000 angstroms, and the third layer 151c is formed to have a thickness of 1000 angstroms to 2000 angstroms. An electrode that includes the electroless plating film 153 is, when compared with an electrode that does not include the electroless plating film 153, likely to cause detachment. This is because a piezoelectric device is distorted by stress generated by the electroless plating film 153. However, in the first metal film 151, formation of the second layer 151b prevents spread of the chrome (Cr), thus adhesion between the first metal film 151 and the base material of the base plate 120 is kept strongly. This prevents detachment of the electrode even if the piezoelectric device 100 is distorted by stress applied by the electroless plating film 153.

The second metal film 152 includes a first layer 152a, a second layer 152b, and a third layer 152c. The first layer 152a is formed to cover the first metal film 151. The second layer 152b is formed on the surface of the first layer 152a. The third layer 152c is formed on the surface of the second layer 152b. The first layer 152a, the second layer 152b, and the third layer 152c are formed of the same constitution as the first layer 151a, the second layer 151b, and the third layer 151c of the first metal film 151, respectively. That is, the second metal film 152 is formed of the same constitution as the first metal film 151.

The electroless plating film 153 is formed of the first layer 153a and a second layer 153b. The first layer 153a is formed on a surface of the second metal film 152. The second layer 153b is formed on a surface of the first layer 153a. The first layer 153a is a nickel (Ni) layer and has the thickness TN of 1 to 3 μm. To ensure connection of the hot terminal 124a and a solder or similar material, the second layer 153b made of a gold (Au) is formed on a surface of the first layer 153a.

The electroless plating film 153 is formed of two layers: the first layer 153a and the second layer 153b. The first layer 153a is formed on a surface of the second metal film 152. The second layer 153b is formed on a surface of the first layer 153a. The electroless plating film 153 includes the first layer 153a and the second layer 153b. The first layer 153a is a nickel (Ni) layer, and the second layer 153b is a gold (Au) layer.

Figure 2C:
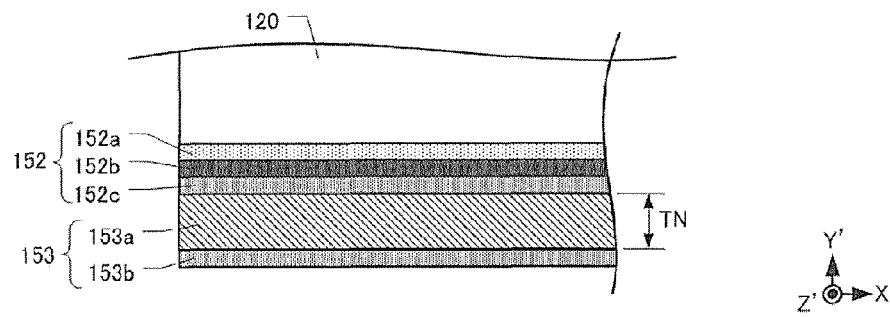
FIG. 2C is an enlarged view of the portion enclosed by a dotted line 162 of FIG. 2A.

FIG. 2C is an enlarged view of the portion enclosed by a dotted line 162 of FIG. 2A. FIG. 2C illustrates an enlarged cross-sectional view of the grounding terminal 124b. The grounding terminal 124b does not include the first metal film 151. The second metal film 152 is formed on the surface at the −Y'-axis side of the base material of the base plate 120. The electroless plating film 153 is formed on the surface of the second metal film 152. The second metal film 152 and the electroless plating film 153, which form the grounding terminal 124b, are formed of the same constitution as the second metal film 152 and the electroless plating film 153, which are formed on the hot terminal 124a.

Figure 3A:
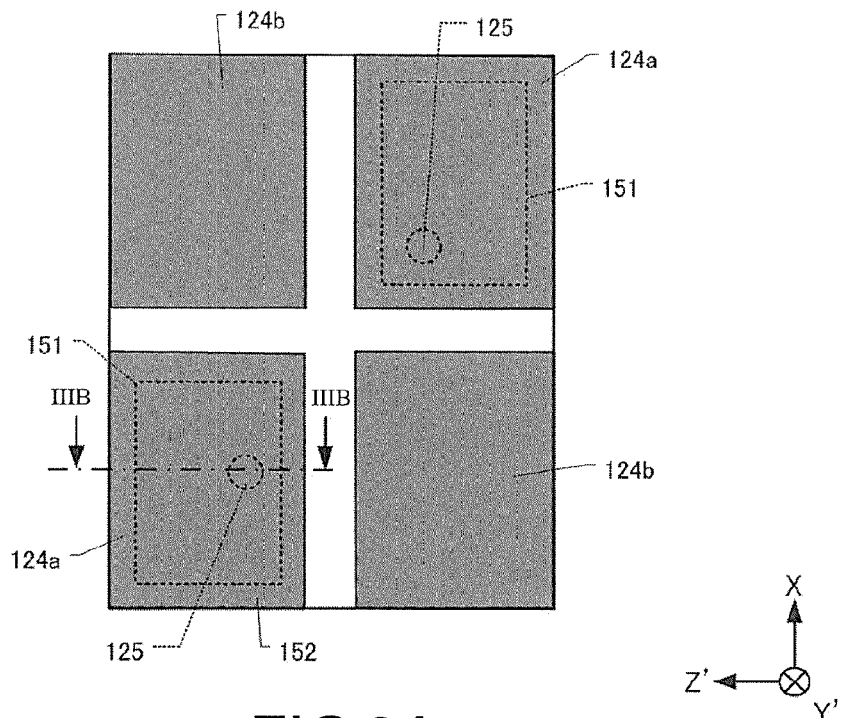
FIG. 3A is a plan view of the surface at the —Y'-axis side of a base plate 120.

FIG. 3A is a plan view of the surface at the −Y'-axis side of the base plate 120. The hot terminals 124a are formed on regions at the +X-axis side and the −Z'-axis side, and at the −X-axis side and the +Z'-axis side of the base plate 120. The grounding terminals 124b are formed on regions at the +X-axis side and the +Z'-axis side, and at the −X-axis side and the −Z'-axis side of the base plate 120. FIG. 3A illustrates a region where the first metal film 151 is to be formed by the dotted line. In the base plate 120, the first metal film 151 is formed not in contact with an outer periphery of the base plate 120. The outline in the X-Z' plane of the hot terminal 124a and the grounding terminal 124b is formed by the second metal film 152.

Figure 3B:
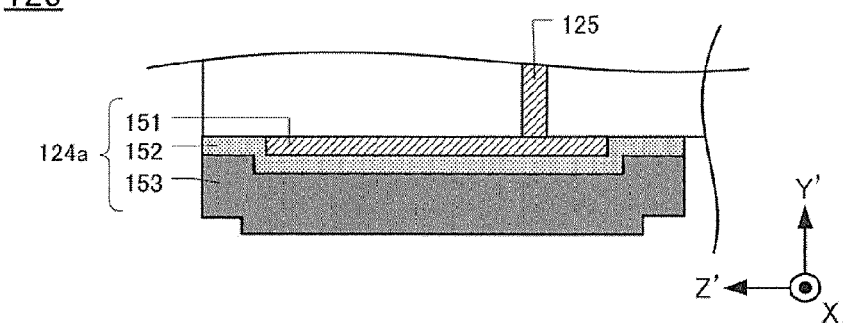
FIG. 3B is a cross-sectional view taken along the line IIIB-IIIB of FIG. 3A.

FIG. 3B is a cross-sectional view taken along the line IIIB-IIIB of FIG. 3A. The first metal film 151 of the hot terminal 124a is electrically connected to a through electrode 125. Additionally, the second metal film 152 is formed to cover the first metal film 151, and the electroless plating film 153 is formed on a surface of the second metal film 152.

Figure 3C:
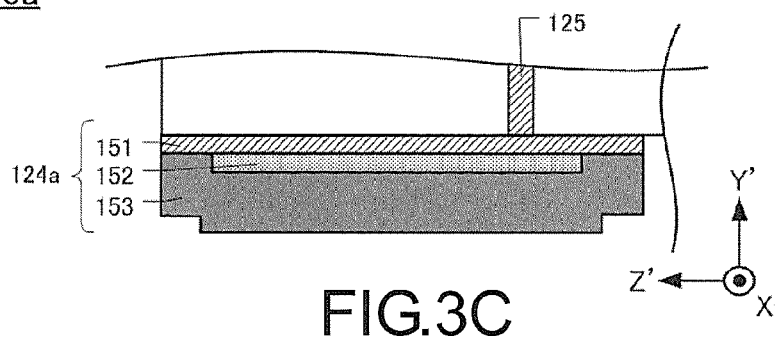

FIG. 3C is a partial cross-sectional view of a base plate 120a. The base plate 120a is a modification of the base plate 120 and differs from the base plate 120 in the constitution of the first metal film 151 and the second metal film 152 of the hot terminal 124a. FIG. 3C illustrates a partial cross-sectional view of a cross section corresponding to the cross section taken along the line IIIB-IIIB of the base plate 120a in FIG. 3A. In the hot terminal 124a of the base plate 120a, the first metal film 151 forms the outline in the X-Z' plane of the hot terminal 124a. Further, the second metal film 152 is formed on a part of a surface of the first metal film 151. The second metal film 152 has a narrower area than the first metal film 151. Furthermore, the electroless plating film 153 is formed on the surface of the first metal film 151 where the second metal film 152 is not formed and the surface of the second metal film 152. In the hot terminal 124a, as illustrated in FIG. 3C, the second metal film 152 may be formed on a part of the surface of the first metal film 151.

Fabrication Method of the Piezoelectric Device 100

Figure 4:
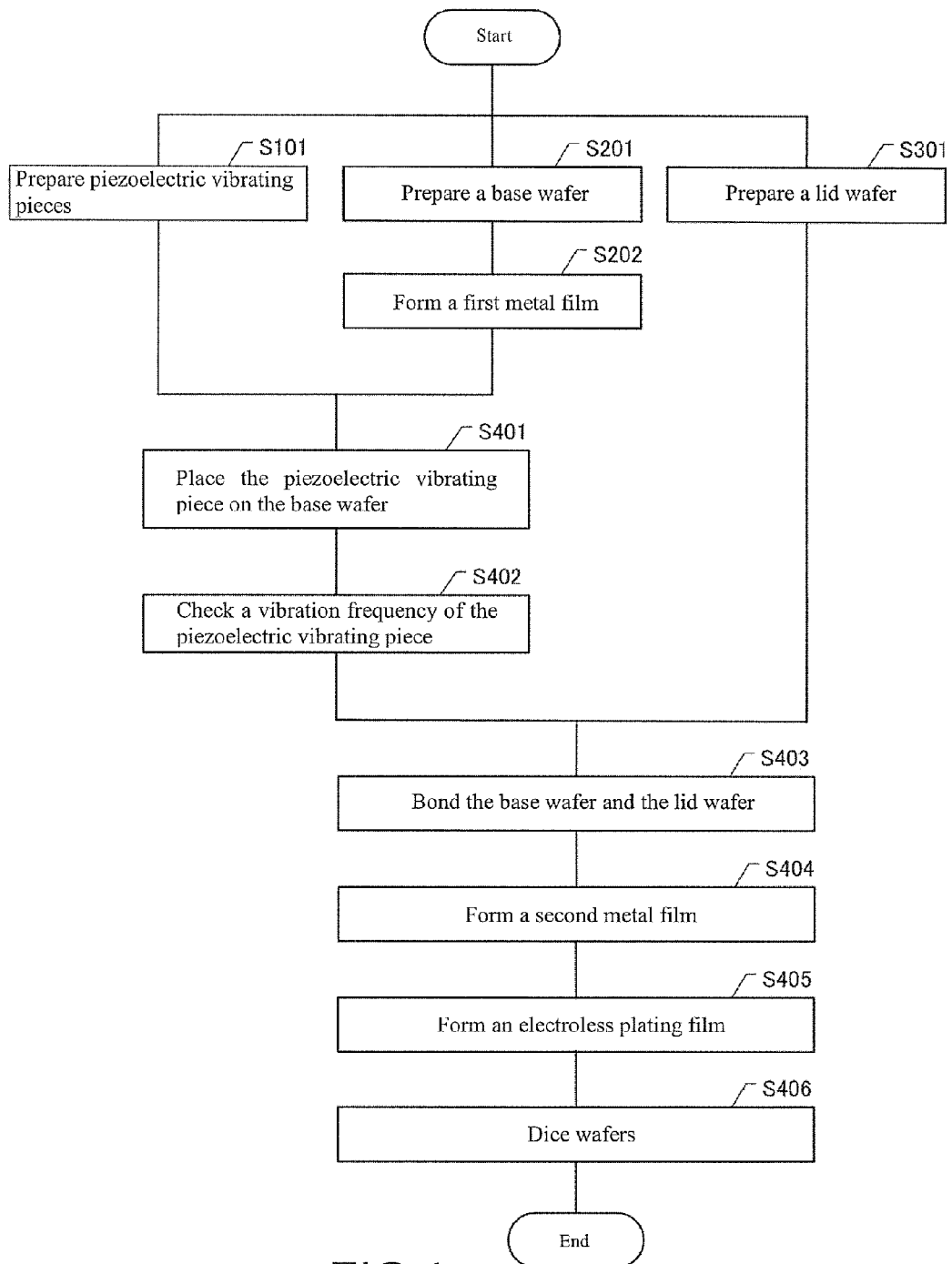
FIG. 4 is a flowchart illustrating a method for fabricating the piezoelectric device 100.

FIG. 4 is a flowchart illustrating a method for fabricating the piezoelectric device 100. A description will be given of the method for fabricating the piezoelectric device 100 following the flowchart of FIG. 4.

In step S101, a plurality of piezoelectric vibrating pieces 130 is prepared. In step S101, first, an outline of the plurality of piezoelectric vibrating pieces 130 is formed on a piezoelectric wafer, which is made of a piezoelectric material, by etching. Further, the excitation electrode 131 and the extraction electrode 132 are formed on each piezoelectric vibrating piece 130 by a method such as sputtering or vacuum evaporation. The plurality of piezoelectric vibrating pieces 130 is prepared by folding and removing the piezoelectric vibrating piece 130 from the piezoelectric wafer.

In step S201, a base wafer W120 is prepared. A plurality of base plates 120 is formed on the base wafer W120. The base wafer W120 employs a material such as a crystal or a glass as the base material. In each base plate 120, etching forms a hole that passes through the base plate to form a depressed portion 121 and the through electrode 125.

In step S202, the first metal film 151 is formed on the base wafer W120. Step S202 is a process for forming a first metal film. The first metal film 151, which is formed on the base wafer W120, is formed of, as illustrated in FIG. 2B, the first layer 151a, the second layer 151b, and the third layer 151c. A chrome (Cr) constitutes the first layer 151a, a nickel tungsten (Ni—W) or a platinum (Pt) constitutes the second layer 151b, and a gold (Au) constitutes the third layer 151c. These layers are formed by sputtering or vacuum evaporation. In step S202, formation of the first metal film 151 forms the connecting electrode 123, a through electrode 125, and a part of the hot terminal 124a on each base plate 120.

Figure 5A:
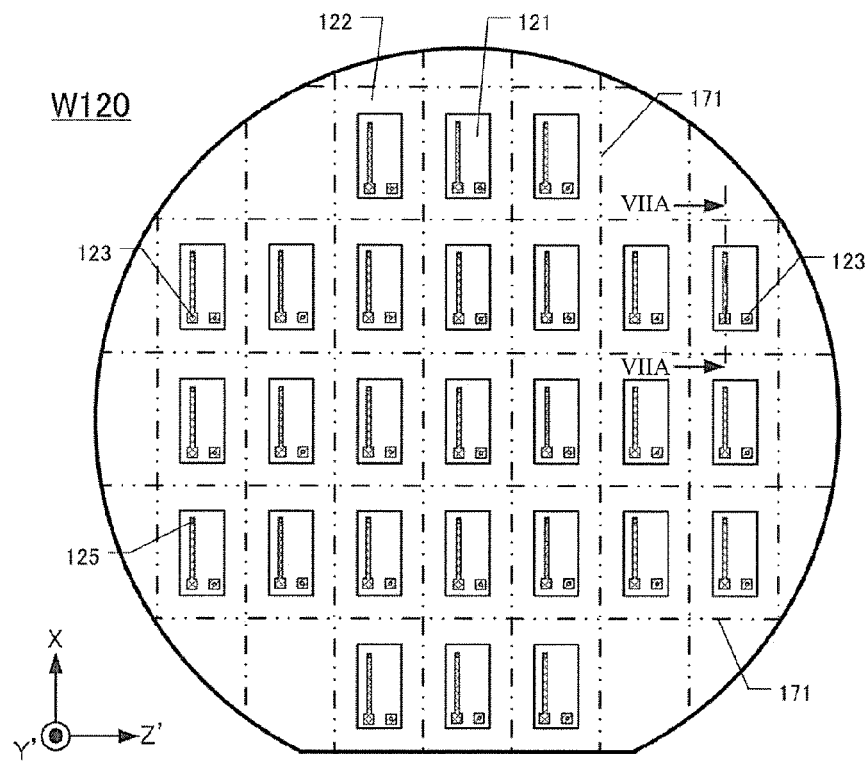
FIG. 5A is a plan view of the surface at the +Y'-axis side of a base wafer W120.

FIG. 5A is a plan view of the surface at the +Y'-axis side of the base wafer W120. FIG. 5A illustrates a plan view of the base wafer W120 after the first metal film 151 has been formed. A plurality of base plates 120 is formed on the base wafer W120. The depressed portion 121, the connecting electrode 123, and the through electrode 125 are formed in each base plate 120. Each base plate 120 is aligned in the X-axis direction and the Z'-axis direction. In FIG. 5A, a scribe line 171 is illustrated at a boundary between the base plates 120 adjacent one another. The scribe line 171 is a line that indicates a position where the wafer is diced in step S504, which will be described below. The connecting electrode 123 is formed in the depressed portion 121 of each base plate 120.

Figure 5B:
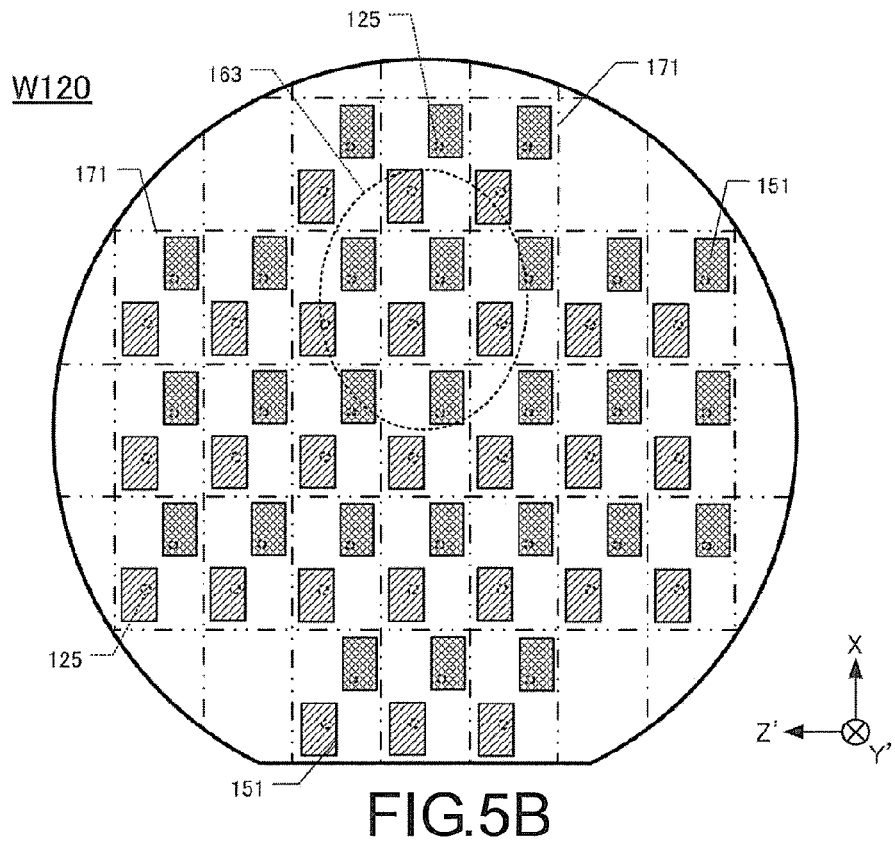
FIG. 5B is a plan view of the surface at the −Y'-axis side of the base wafer W120.

FIG. 5B is a plan view of the surface at the −Y'-axis side of the base wafer W120. The first metal film 151 is formed on the surface at the −Y'-axis side of the base wafer W120. The first metal film 151 becomes a part of the hot terminal 124a. The first metal film 151 electrically connects to the connecting electrode 123 via the through electrode 125.

Returning to FIG. 4, in step S301, a lid wafer W110 is prepared. A plurality of lid plates 110 is formed on the lid wafer W110. The depressed portion 111 is formed on each lid plate 110.

Figure 6:
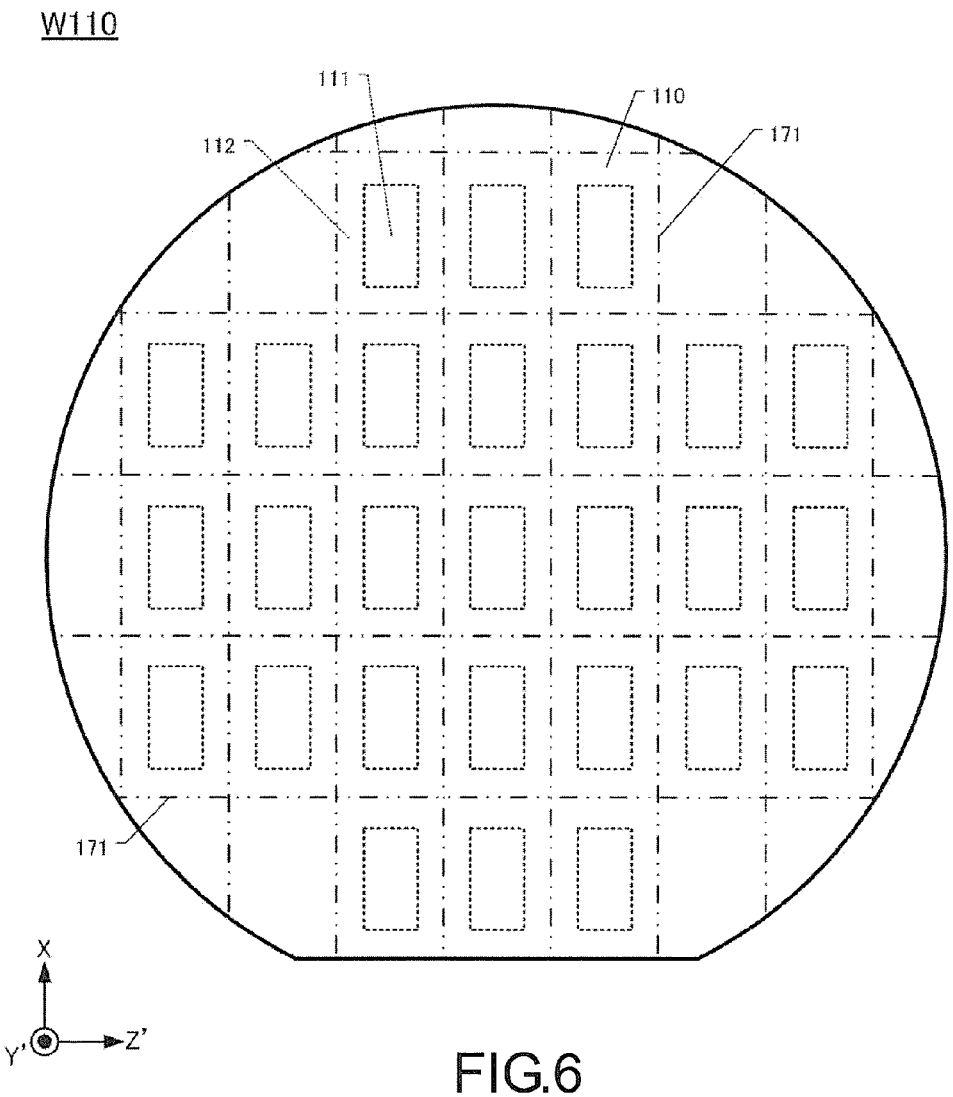
FIG. 6 is a plan view of a lid wafer W110.

FIG. 6 is a plan view of the lid wafer W110. A plurality of lid plates 110 is formed on the lid wafer W110. The depressed portion 111 and a bonding surface 112 are formed on the surface at the −Y'-axis side of each lid plate 110. In FIG. 6, a two-dot chain line is drawn between the lid plates 110 adjacent one another. This two-dot chain line is the scribe line 171.

In step S401, the piezoelectric vibrating piece 130 is placed on the base wafer W120. Step S401 is a placement process. The piezoelectric vibrating piece 130 is placed above each depressed portion 121 of the base wafer W120 with the conductive adhesive 141.

Figure 7A:
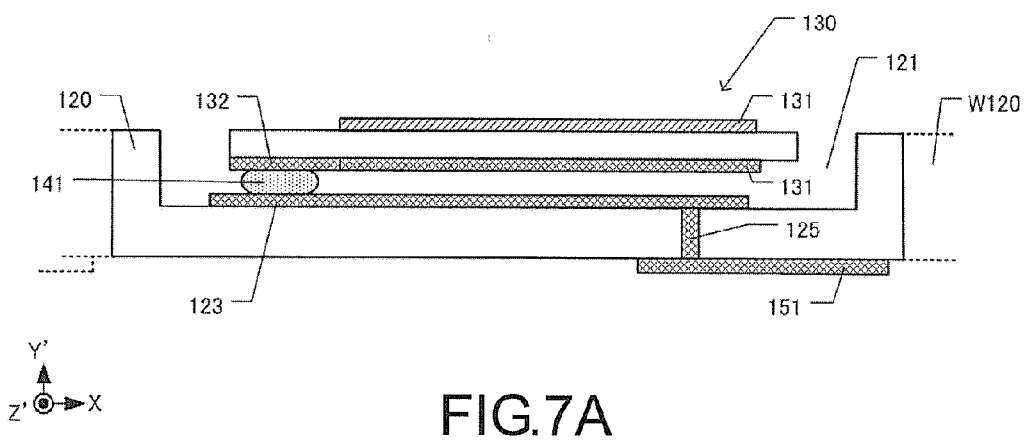
FIG. 7A is a partial cross-sectional view of the base wafer W120 where a piezoelectric vibrating piece 130 has been placed.

FIG. 7A is a partial cross-sectional view of the base wafer W120 where the piezoelectric vibrating piece 130 has been placed. FIG. 7A illustrates a cross-sectional view including a cross section taken along the line VIIA-VIIA of FIG. 5A. The extraction electrode 132 and the connecting electrode 123 are electrically connected together via the conductive adhesive 141. Thus, the piezoelectric vibrating piece 130 is placed above the depressed portion 121 of the base wafer W120. This electrically connects the excitation electrode 131 and the first metal film 151, which forms the hot terminal 124a.

In step S402, a vibration frequency of a vibrator 134 of the piezoelectric vibrating piece 130 is checked. Step S402 is a vibration frequency checking process. The vibration frequency of the vibrator 134 is checked by contacting a probe 172 to the first metal film 151 formed at the −Y'-axis side of the base plate 120.

Figure 7B:
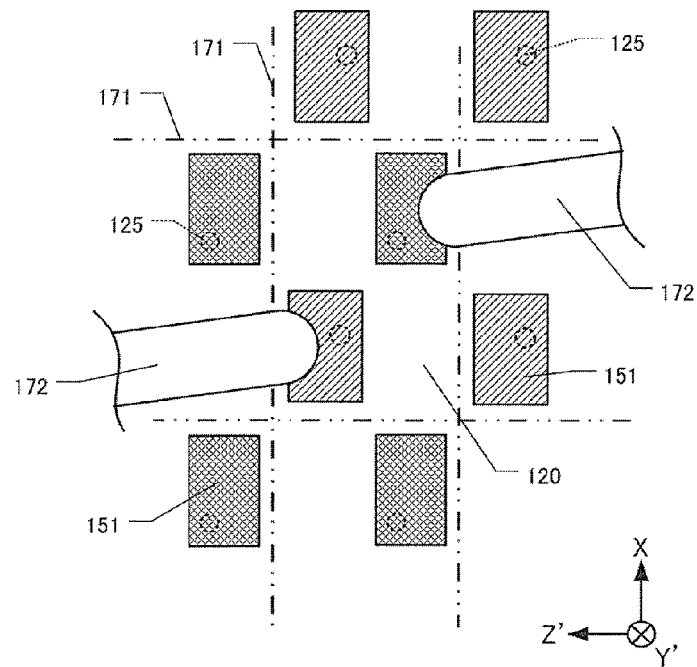
FIG. 7B is an enlarged plan view of the portion enclosed by a dotted line 163 of FIG. 5B.

FIG. 7B is an enlarged plan view of the portion enclosed by a dotted line 163 of FIG. 5B. FIG. 7B illustrates a state where a vibration frequency of one base plate 120 in the base wafer W120 is checked. The vibration frequency of the vibrator 134 is checked by bringing each pair of probes 172 into contact with the first metal film 151, which constitutes a pair of hot terminals 124a of one base plate 120. In FIG. 7B, the first metal film 151, which constitutes the hot terminal 124a, electrically connects to an excitation electrode 131 of the piezoelectric vibrating piece 130 via the through electrode 125. Additionally, one first metal film 151 is not electrically connected to another first metal film 151. In FIG. 7B, since the grounding terminal 124b is not formed, an electrode is not formed on regions adjacent to the X-axis direction and the Z'-axis direction of one first metal film 151.

As the piezoelectric device becomes smaller in size, the base plate 120 also becomes smaller in size. Accordingly, the area of the hot terminal becomes small. In contrast, the distal end of a probe is not downsized. Seen relatively, the size of the distal end of the probe becomes large relative to the area of the hot terminal. Accordingly, at measurement of a vibration frequency, the probe 172 contacts another adjacent electrode, thus the vibration frequency of the vibrator cannot be checked accurately in some cases. In the base plate 120, an electrode is not formed at a peripheral area of the first metal film 151, which forms the hot terminal 124a; therefore, the probe 172 does not contact another electrode. This enables accurate checking of the vibration frequency.

In step S403, the base wafer W120 and the lid wafer W110 are bonded together. Step S403 is a bonding process. The base wafer W120 and the lid wafer W110 are bonded as follows. The sealing material 142 (see FIG. 2A) is applied to the bonding surface 122 of the base wafer W120 or the bonding surface 112 of the lid wafer W110. Then, the bonding surface 122 of the base wafer W120 and the bonding surface 112 of the lid wafer W110 are bonded together such that they face each other while sandwiching the sealing material 142.

In step S404, the second metal film 152 is formed. Step S404 is a process for forming a second metal film. The second metal film 152 is formed on the surface at the −Y'-axis side of the base plate 120 such that the second metal film 152 forms an outline of the hot terminal 124a and the grounding terminal 124b.

Figure 8A:
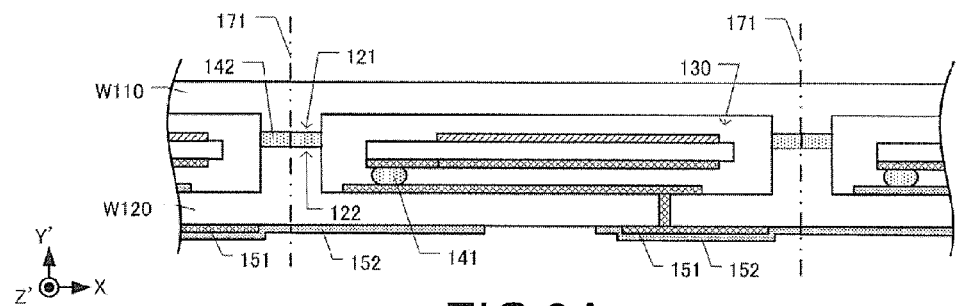
FIG. 8A is a partial cross-sectional view of the base wafer W120 where a second metal film 152 has been formed, the piezoelectric vibrating piece 130, and the lid wafer W110.

FIG. 8A is a partial cross-sectional view of the base wafer W120 where the second metal film 152 has been formed, the piezoelectric vibrating piece 130, and the lid wafer W110. FIG. 8A illustrates a cross-sectional view including the cross section taken along the line VIIA-VIIA of FIG. 5A. The second metal film 152 is formed to cover the surface of the first metal film 151 such that the outline of the hot terminal 124a is formed. Additionally, the second metal film 152 is formed to form the outline of the grounding terminal 124b.

As illustrated in FIG. 3A and FIG. 3B, the outline of the hot terminal 124a of the base plate 120 is determined only by the second metal film 152. Accordingly, even if the relative position between the first metal film 151 and the second metal film 152 is shifted by a shift of pattern, a collapse of the outer shape of the hot terminal 124a is avoided. In the base plate 120a illustrated in FIG. 3C as well, the shape of the hot terminal 124a is determined only by the first metal film 151. Similar to the base plate 120, a collapse of the terminal shape of the hot terminal 124a is avoided.

In step S405, the electroless plating film 153 is formed. Step S405 is a process of forming an electroless plating film. The electroless plating films 153 is formed by performing electroless plating on the surface of the second metal film 152.

Figure 8B:
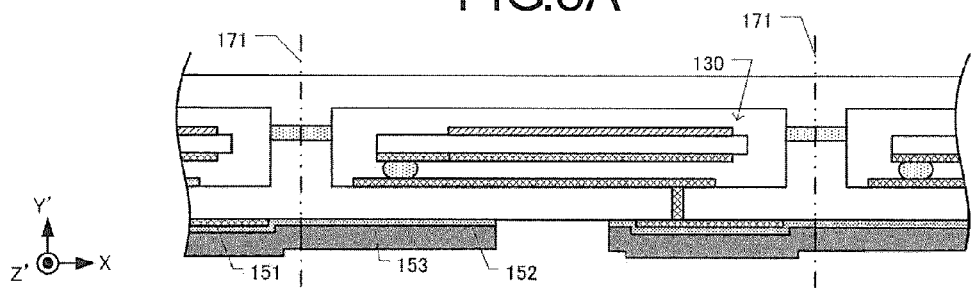
FIG. 8B is a partial cross-sectional view of the lid wafer W110, the piezoelectric vibrating piece 130, and the base wafer W120 where an electroless plating film 153 has been formed.

FIG. 8B is a partial cross-sectional view of the lid wafer W110, the piezoelectric vibrating piece 130, and the base wafer W120 where the electroless plating film 153 has been formed. FIG. 8B illustrates a cross section similar to FIG. 8A. First, as illustrated in FIG. 2B, a thick film made of a nickel (Ni) is formed as a first layer 153a of the electroless plating film 153 by electroless plating. Further, an electroless plating is performed with a gold (Au) on the surface of the first layer 153a, thus the second layer 153b is formed.

Figure 8C:
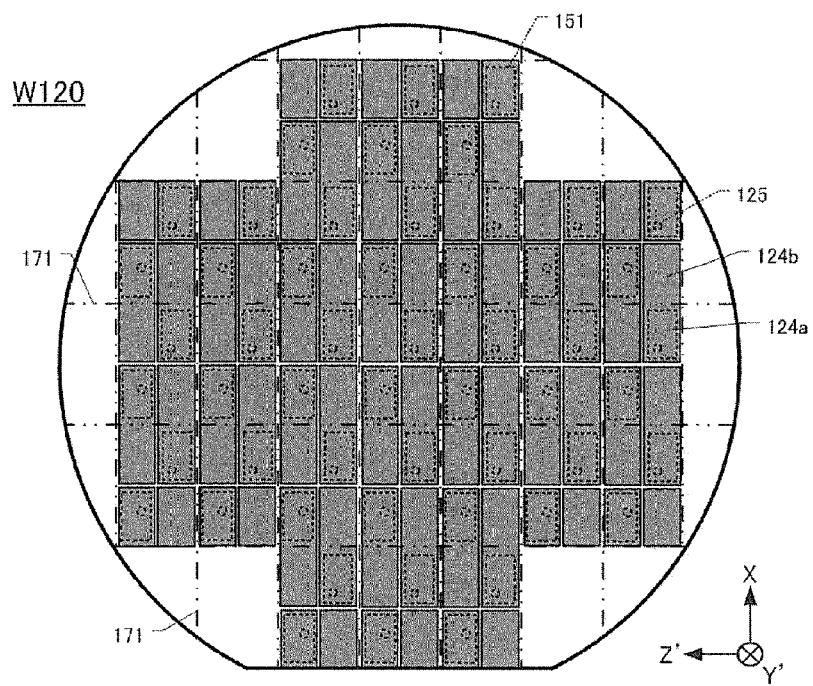
FIG. 8C is a plan view of a surface at the −Y'-axis side of the base wafer W120 where the electroless plating film 153 has been formed.

FIG. 8C is a plan view of the surface at the −Y'-axis side of the base wafer W120 where the electroless plating film 153 has been formed. In FIG. 8C, the formation region of the first metal film 151 and the position of the through electrode 125 are illustrated by the dotted line. As illustrated in FIG. 8C, formation of the second metal film 152 and the electroless plating film 153 forms the hot terminal 124a and the grounding terminal 124b on the surface at the −Y'-axis side of the base wafer W120.

Figure 9:
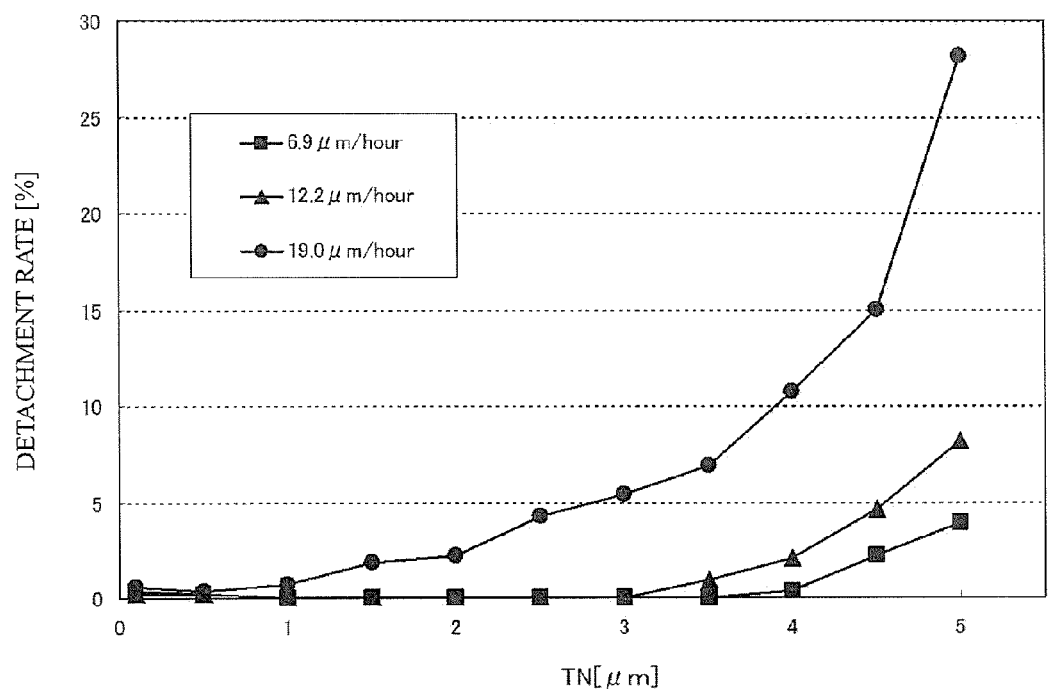
FIG. 9 is a graph illustrating a relationship between a thickness TN of a nickel (Ni) layer of the electroless plating film 153 and a detachment rate of the electroless plating film 153.

FIG. 9 is a graph illustrating a relationship between a thickness TN of a nickel (Ni) layer of the electroless plating film 153 and a detachment rate of the electroless plating film 153. FIG. 9 illustrates results in the case where the nickel (Ni) layer of the electroless plating film 153 is formed under conditions of three speeds: 6.9 μm/hour, 12.2 μm/hour, and 19.0 μm/hour. In the graph, the black square indicates a formation speed of 6.9 μm/hour, the black triangle indicates a formation speed of 12.2 μm/hour, and the black circle indicates a formation speed of 19.0 μm/hour. The formation speed can be adjusted, for example, by a temperature condition. The following is assumed. When the formation speed is 6.9 μm/hour, the temperature is 45° C. to 55° C. When the formation speed is 12.2 μm/hour, the temperature is 60° C. to 70° C. When the formation speed is 19.0 μm/hour, the temperature is 70° C. to 80° C. The detachment rate is obtained by performing the following methods. A scratch test confirms whether the metal film detaches or not by scratching a surface of the metal film with a metal needle or a diamond stylus. A tape peeling test confirms whether the metal film detaches or not by peeling a tape pasted on the metal film. The detachment rate in FIG. 9 indicates a rate of the number of individuals from which the metal film is detached relative to the number of individuals that are target for the tests.

In the case where the formation speeds are 6.9 μm/hour and 12.2 μm/hour, the detachment rate exists but is small when the thickness TN of the nickel layer is 0.1 μm to 1 μm. This is possibly because when the thickness TN of the nickel layer is thin, the nickel layer is not secured to the surface of the metal film. In the case where the formation speed is 6.9 μm/hour, the detachment rate is 0% at the thickness TN of between 1 μm to 3.5 μm and increases when the thickness TN becomes equal to or more than 3.5 μm. In the case where the formation speed is 12.2 μm/hour, the detachment rate is 0% at the thickness TN of between 1 μm to 3 μm and increases when the thickness TN becomes equal to or more than 3 μm. In the case where the formation speed is 19.0 μm/hour, the detachment rate exists but is small when the thickness TN of the nickel layer is 0.1 μm to 1 μm. In the case where the thickness TN is 1 μm, the detachment rate becomes the lowest value. In the case where the thickness TN is equal to or more than 1 μm, the detachment rate increases as the thickness TN becomes thick.

It can be seen from the graph of FIG. 9, when the formation speed of the nickel layer is from 6.9 μm/hour to 12.2 μm/hour and the film thickness of the nickel layer is 1.0 μm to 3.0 μm, the detachment rate becomes 0%. This is a preferred condition. Further, it is considered when the formation speed of the nickel layer is from 5 μm/hour to 15 μm/hour, at least the detachment rate becomes 0% or a value close to 0%. This is a preferred condition.

Returning to FIG. 4, in step S406, the lid wafer W110 and the base wafer W120 are diced. The lid wafer W110 and the base wafer W120 are diced at the scribe line 171 by a method such as dicing. Thus, individually divided piezoelectric devices 100 are formed.

In the piezoelectric device 100, the second metal film 152 is formed in step S404, which is immediately before step S405 where the electroless plating film 153 is formed. This prevents interference of formation of the electroless plating film 153 by contamination of a foundation layer to form the electroless plating film 153. When the vibration frequency of the vibrator 134 of the piezoelectric vibrating piece 130 is measured (step S402), the grounding terminal 124b is not formed, and the probe 172 does not contact another terminal. This enables accurate measurement of the vibration frequency value of the vibrator 134. The formation speed of the nickel layer of the electroless plating film 153 is set to 5 μm/hour to 15 μm/hour, and the thickness TN of the nickel layer is set to 1 μm to 3 μM. This reduces the detachment rate of the electroless plating film 153.

Second Embodiment

A piezoelectric vibrating piece that includes a framing portion at a peripheral area of a vibrator may be employed as a piezoelectric vibrating piece. A description will be given of a piezoelectric device 200 where a piezoelectric vibrating piece with a framing portion is employed. The embodiment will now be described wherein like reference numerals designate corresponding or identical elements throughout the embodiments.

Constitution of the Piezoelectric Device 200

Figure 10:
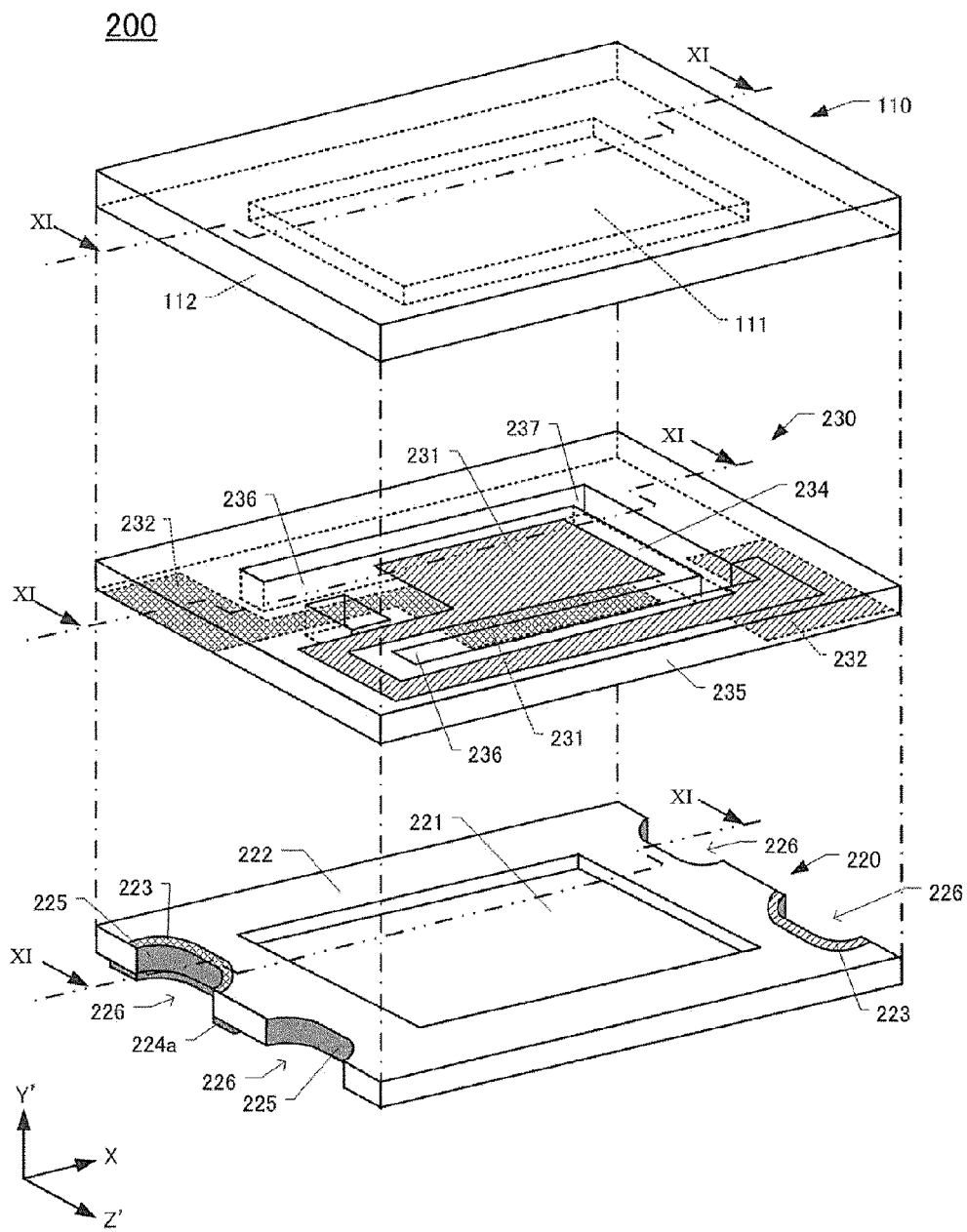
FIG. 10 is an exploded perspective view of a piezoelectric device 200.

FIG. 10 is an exploded perspective view of the piezoelectric device 200. The piezoelectric device 200 includes a lid plate 110, a base plate 220, and a piezoelectric vibrating piece 230. With the piezoelectric device 200, similar to the first Embodiment, an AT-cut quartz-crystal vibrating piece is employed for the piezoelectric vibrating piece 230.

The piezoelectric vibrating piece 230 includes a vibrator 234, a framing portion 235, and a connecting portion 236. The vibrator 234 vibrates at a predetermined frequency and has a rectangular shape. The framing portion 235 is formed to surround a peripheral area of the vibrator 234. The connecting portion 236 connects the vibrator 234 and the framing portion 235 together. Between the vibrator 234 and the framing portion 235, a through groove 237 that passes through the piezoelectric vibrating piece 230 in the Y'-axis direction is formed. The vibrator 234 and the framing portion 235 do not directly contact one another. The vibrator 234 and the framing portion 235 are connected together via the connecting portion 236 connected at the −X-axis side and the +Z'-axis side, and at the −X-axis side and the −Z'-axis side of the vibrator 234. Further, excitation electrodes 231 are formed on surfaces at the +Y'-axis side and the −Y'-axis side of the vibrator 234. An extraction electrode 232 is extracted from each excitation electrode 231 to the framing portion 235. The extraction electrode 232 is extracted from the excitation electrode 231 formed on the surface at the +Y'-axis side of the vibrator 234. The extraction electrode 232 is extracted to the −X-axis side of the framing portion 235 via the connecting portion 236 at the −Z'-axis side and extracted up to the corner at the +X-axis side and the +Z'-axis side on the surface at the −Y'-axis side of the framing portion 235. The extraction electrode 232 is extracted from the excitation electrode 231 formed on the surface at the −Y'-axis side of the vibrator 234. The extraction electrode 232 is extracted to the −X-axis side of the framing portion 235 via the connecting portion 236 at the −Z'-axis side and extracted up to the corner at the −X-axis side and the −Z'-axis side on the surface at the −Y'-axis side of the framing portion 235.

A bonding surface 222 is formed at the peripheral area of the surface at the +Y'-axis side of the base plate 220. The bonding surface 222 is to be bonded to the surface at the −Y'-axis side of the framing portion 235 via a sealing material 142 (see FIG. 11). The base plate 220 includes a depressed portion 221 at the center of the surface at the +Y'-axis side. The depressed portion 221 is depressed from the bonding surface 222 in the −Y'-axis direction. A hot terminal 224a and a grounding terminal 224b are formed on the surface at the −Y'-axis side of the base plate 220 (see FIG. 12A). Castellations 226 are formed at the +Z'-axis side and the −Z'-axis side on side surfaces at the +X-axis side and the −X-axis side of the base plate 220. The castellation 226 is depressed inside of the base plate 220. Additionally, at peripheral areas of the castellations 226 formed at the +X-axis side and the +Z'-axis side, and at the −X-axis side and the −Z'-axis side on the bonding surface 222, a connecting electrode 223 is formed. The connecting electrode 223 is electrically connected to an extraction electrode 232. The connecting electrode 223 electrically connects to the hot terminal 224a via a side surface electrode 225 formed on the castellation 226.

Figure 11:
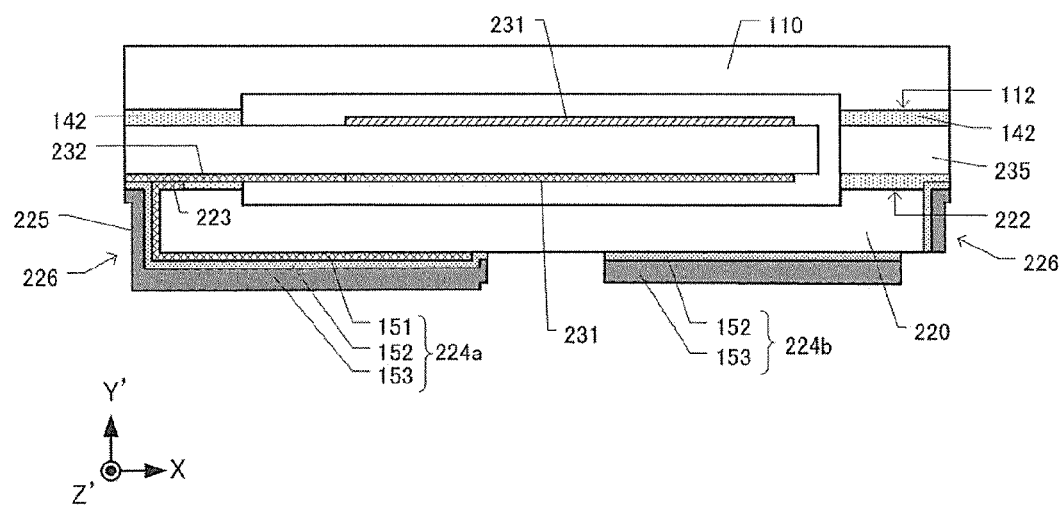
FIG. 11 is a cross-sectional view taken along the line XI-XI of FIG. 10.

FIG. 11 is a cross-sectional view taken along the line XI-XI of FIG. 10. The piezoelectric device 200 is formed by bonding the bonding surface 112 of the lid plate 110 and the surface at the +Y'-axis side of the framing portion 235 together via the sealing material 142. The bonding surface 222 of the base plate 220 and the framing portion 235 are bonded together via the sealing material 142. The extraction electrode 232 and the connecting electrode 223 are electrically bonded together at bonding of the piezoelectric vibrating piece 230 and the base plate 220. This electrically connects the excitation electrode 231 to the hot terminal 224a. The hot terminal 224a is formed of the first metal film 151, the second metal film 152, and the electroless plating film 153. The grounding terminal 224b is formed of the second metal film 152 and the electroless plating film 153. The constitution of the hot terminal 224a and the grounding terminal 224b is the same as the constitution of the hot terminal 124a and the grounding terminal 124b illustrated in FIG. 2B and FIG. 2C.

Figure 12A:
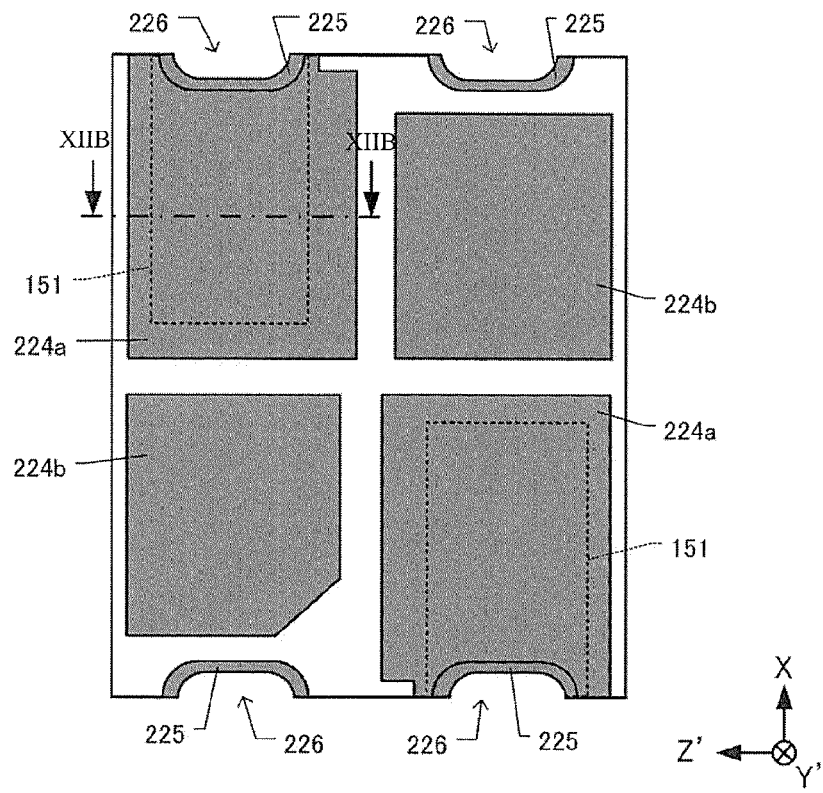
FIG. 12A is a plan view of a surface at the −Y'-axis side of a base plate 220.

FIG. 12A is a plan view of the surface at the −Y'-axis side of the base plate 220. The hot terminal 224a and the grounding terminal 224b are formed on the surface at the −Y'-axis side of the base plate 220. The hot terminals 224a are formed at the +X-axis side and the +Z'-axis side and at the −X-axis side and the −Z'-axis side. The grounding terminals 224b are formed at the +X-axis side and the −Z'-axis side and at the −X-axis side and the +Z'-axis side. The hot terminal 224a electrically connects to the side surface electrode 225 formed at the castellation 226.

Figure 12B:
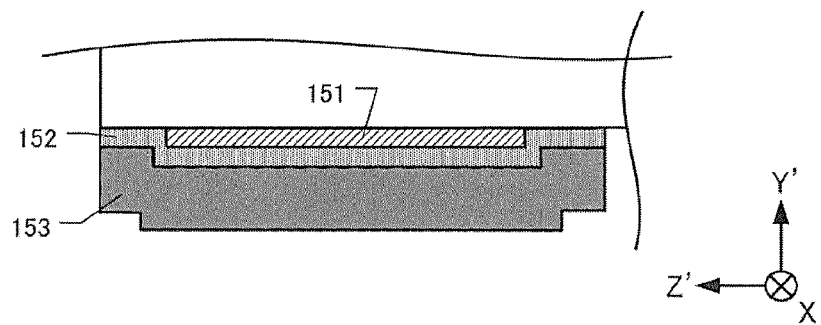
FIG. 12B is a cross-sectional view taken along the line XIIB-XIIB of FIG. 12A.

FIG. 12B is a cross-sectional view taken along the line XIIB-XIIB of FIG. 12A. In the hot terminal 224a, the second metal film 152 is formed to cover the first metal film 151. The electroless plating film 153 is formed on the surface of the second metal film 152.

Fabrication Method of the Piezoelectric Device 200

The piezoelectric device 200 can be fabricated following the flowchart illustrated in FIG. 4. The method for fabricating the piezoelectric device 200 will be described along with a description explaining the differences from the flowchart in FIG. 4.

In step S101, a piezoelectric wafer W230 (see FIG. 13A) where a plurality of piezoelectric vibrating pieces 230 is formed is prepared. Step S101 is a process for preparing a piezoelectric wafer. Additionally, in step S201, a base wafer W220 (see FIG. 13A) where a plurality of base plates 220 is formed is prepared. In step S202, the first metal film 151 is formed on the base wafer W220. Step S201 is a process for preparing a base wafer, and step S202 is a process for forming a first metal film. Furthermore, in step S301, the lid wafer W110 (see FIG. 13A) where a plurality of lid plates 110 is formed is prepared. Step S301 is a process for preparing a lid wafer.

In step S401, the base wafer W220 and the piezoelectric wafer W230 are bonded together. Step S401 is a placement process. The placement process bonds the base wafer W220 and the piezoelectric wafer W230 via the sealing material 142 such that the extraction electrode 232 electrically connects to the connecting electrode 223 of the base plate 220 and the piezoelectric vibrating piece 230 is placed on the base plate 220.

In step S402, the vibration frequency of the vibrator 234 is measured. Step S402 is a vibration frequency checking process. In the vibration frequency checking process, similar to the process illustrated in FIG. 7B, the probe 172 is contacted to the first metal film 151, which constitutes the hot terminal 224a, to measure a vibration frequency. In the base wafer W220, similar to the process illustrated in FIG. 7B, an electrode is not formed on regions adjacent to the X-axis direction and the Z'-axis direction of the first metal film 151 (see FIG. 13B). Contact of the probe 172 to other electrodes does not prevent accurate measurement of vibration frequency.

In step S403, the lid wafer 'W110 and the piezoelectric wafer W230 and bonded together. Step S403 is a bonding process. The bonding process bonds the bonding surface 112 of the lid wafer W110 to the surface at the +Y'-axis side of the framing portion 235 formed on the piezoelectric wafer W230 via the sealing material 142.

In step S404, the second metal film 152 is formed on the base wafer W220. Step S404 is a process for forming a second metal film. Subsequent to step S404, in step S405, the electroless plating film 153 is formed on the surface of the second metal film 152. Step S405 is a process for forming an electroless plating film.

Figure 13A:
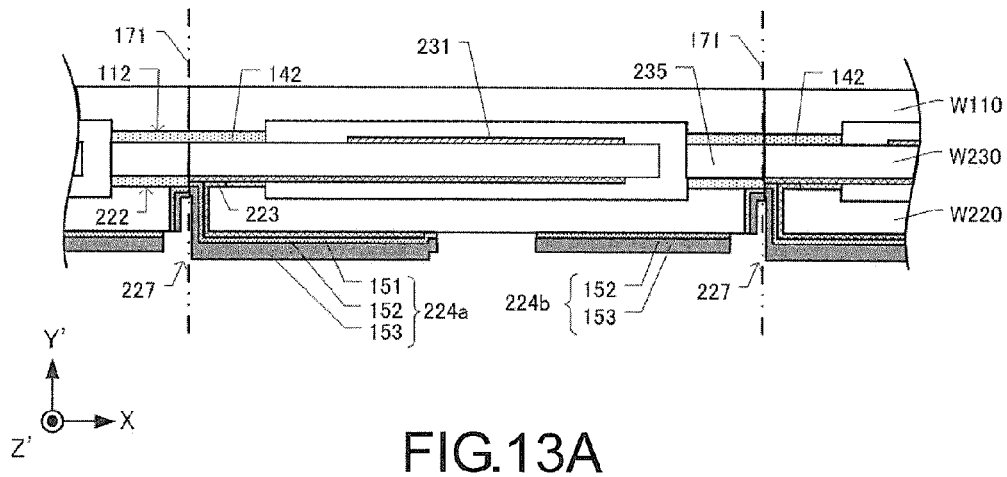
FIG. 13A is a cross-sectional view of the lid wafer W110, a piezoelectric wafer W230, and the base wafer W220 where the electroless plating film 153 has been formed.

FIG. 13A is a cross-sectional view of the lid wafer W110, the piezoelectric wafer W230, and the base wafer W220 where the electroless plating film 153 has been formed. FIG. 13A illustrates a cross section including the cross section taken along the line XI-XI of FIG. 10. The bonding surface 112 of the lid wafer W110 bonds to the surface at the +Y'-axis side of the framing portion 235 of the piezoelectric vibrating piece 230 via the sealing material 142. The bonding surface 222 of the base wafer W220 bonds to the surface at the −Y'-axis side of the framing portion 235 of the piezoelectric vibrating piece 230 via the sealing material 142. The extraction electrode 232 formed on the piezoelectric wafer W230 electrically connects to the connecting electrode 223 of the base wafer W220. The base wafer W220 includes the hot terminal 224a and the grounding terminal 224b on the surface at the −Y'-axis side. The base wafer W220 includes a through hole 227 that becomes the castellation 226 after the wafer is diced. The second metal film 152 and the electroless plating film 153 are also formed on the side surfaces of the through hole 227.

Figure 13B:
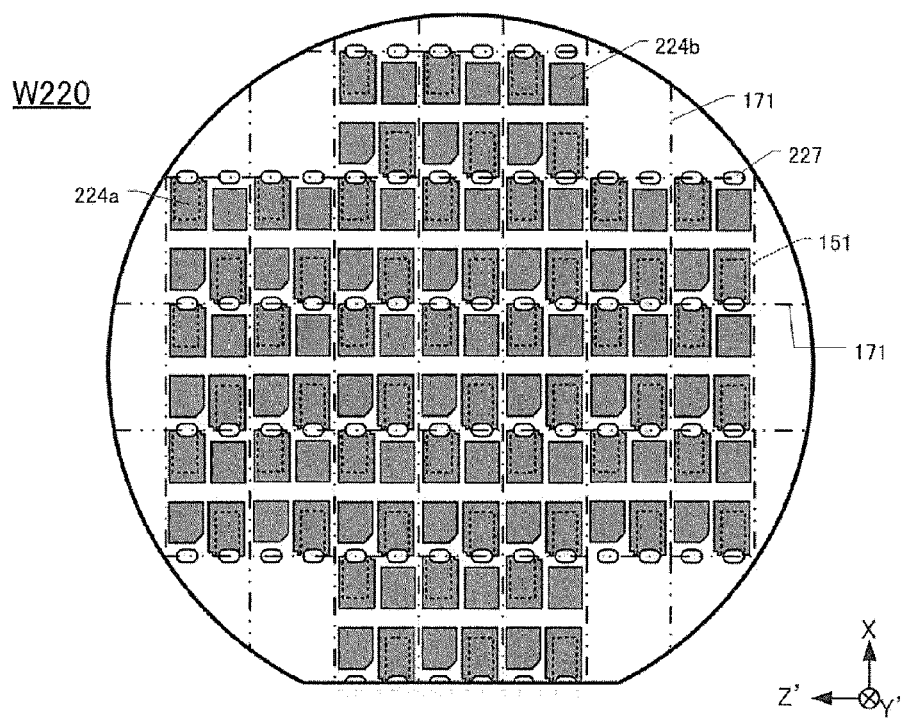
FIG. 13B is a plan view of a surface at the −Y'-axis side of the base wafer W220 where the electroless plating film 153 has been formed.

FIG. 13B is a plan view of the surface at the −Y'-axis side of the base wafer W220 where the electroless plating film 153 has been formed. On the base wafer W220, the through holes 227 are formed on the scribe line 171 extending in the Z'-axis direction. After the wafer is diced in step S406, the through hole 227 becomes the castellation 226. In FIG. 13B, the first metal film 151 is indicated by the dotted line. Only one first metal film 151 is connected to one through hole 227.

In step S406, the base wafer W220, the lid wafer W110, and the piezoelectric wafer W230 are diced. These wafers are diced at the scribe line 171 by a method such as dicing. Thus, individually divided piezoelectric devices 200 are formed.

Third Embodiment

An electrical circuit element may be embedded to the piezoelectric device so as to form a piezoelectric oscillator. A description will be given of a piezoelectric device 300 where an electrical circuit element is embedded. The embodiment will now be described wherein like reference numerals designate corresponding or identical elements throughout the embodiments.

Constitution of the Piezoelectric Device 300

Figure 14:
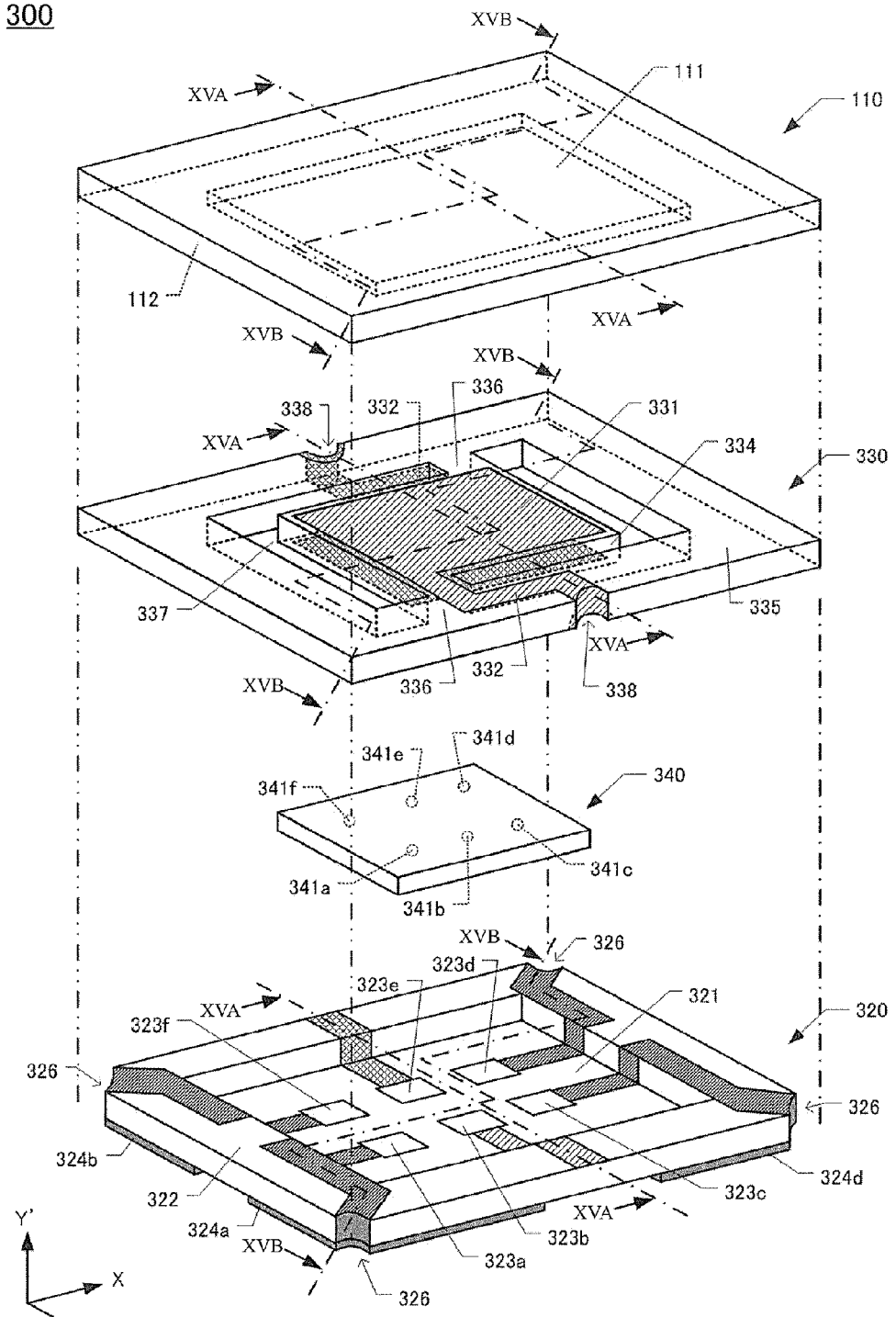
FIG. 14 is an exploded perspective view of a piezoelectric device 300.

FIG. 14 is an exploded perspective view of the piezoelectric device 300. The piezoelectric device 300 includes a lid plate 110, a base plate 320, a piezoelectric vibrating piece 330, and an integrated circuit element 340. In the piezoelectric device 300, similar to the first Embodiment, it is assumed that an AT-cut quartz-crystal vibrating piece is employed for the piezoelectric vibrating piece 330.

The piezoelectric vibrating piece 330 includes a vibrator 334, a framing portion 335, and a connecting portion 336. The vibrator 334 vibrates at a predetermined vibration frequency and has a rectangular shape. The framing portion 335 is formed to surround a peripheral area of the vibrator 334. The connecting portion 336 connects the vibrator 334 and the framing portion 335 together. Between the vibrator 334 and the framing portion 335, a through groove 337 that passes through the piezoelectric vibrating piece 330 in the Y'-axis direction is formed. The vibrator 334 and the framing portion 335 do not directly contact one another. The vibrator 334 and the framing portion 335 are connected together via the connecting portion 336 connected at the −X-axis side and the +Z'-axis side surface, and at the +X-axis side and the −Z'-axis side surface of the vibrator 334. Castellations 338 are formed at the center of the outer side surfaces at the +Z'-axis side and the −Z'-axis side of the framing portion 335. Further, excitation electrodes 331 are formed on surfaces at the +Y'-axis side and the −Y'-axis side of the vibrator 334. An extraction electrode 332 is extracted from each excitation electrode 331 to the framing portion 335. The extraction electrode 332 is extracted from the excitation electrode 331 formed on the surface at the +Y'-axis side of the vibrator 334. The extraction electrode 332 is extracted to the +Z'-axis side of the framing portion 335 via the connecting portion 336 at the +7'-axis side. The extraction electrode 332 is further extracted up to the center at the +Z'-axis side of the surface at the −Y'-axis side of the framing portion 335 via the castellation 338. The extraction electrode 332 is extracted from the excitation electrode 331 formed on the surface at the −Y'-axis side of the vibrator 334. The extraction electrode 332 is extracted to the −Z'-axis side of the framing portion 335 via the connecting portion 336 at the −Z'-axis side. The extraction electrode 332 is extracted up to the center at the −Z'-axis side of the surface at the +Y'-axis side of the framing portion 335 via the castellation 338.

The base plate 320 is formed in a rectangular shape. A bonding surface 322 is formed at a peripheral area of the surface at the +Y'-axis side. The bonding surface 322 is to be bonded to the lid plate 110 via the sealing material 142 (see FIG. 15B). At the center of the surface at the +Y'-axis side of the base plate 320, a depressed portion 321 depressed from the bonding surface 322 in the −Y'-axis direction is formed. Further, the base plate 320 includes castellations 326 at four corners of the side surfaces. The castellation 326 is depressed inside of the base plate 320.

Six connecting electrodes are formed on the depressed portion 321. A connecting electrode 323a is formed at the −X-axis side and the +Z'-axis side in the depressed portion 321. A connecting electrode 323b is formed at the center of the +Z'-axis side in the depressed portion 321. A connecting electrode 323c is formed at the +X-axis side and the +Z'-axis side in the depressed portion 321. A connecting electrode 323d is formed at the +X-axis side and the −Z'-axis side in the depressed portion 321. A connecting electrode 323e is formed at the center of the −Z'-axis side in the depressed portion 321. A connecting electrode 323f is formed at the −X-axis side and the −Z'-axis side in the depressed portion 321. Additionally, the base plate 320 includes the following terminals on the surface at the −Y'-axis side. A standby terminal 324a is formed at the −X-axis side and the +Z'-axis side. A power source terminal 324b is formed at the −X-axis side and the −Z'-axis side. An output terminal 324c is formed at the +X-axis side and the −Z'-axis side (see FIG. 15C). A grounding terminal 324d is formed at the +X-axis side and the +Z'-axis side. The connecting electrode 323a electrically connects to the standby terminal 324a via the castellation 326. The connecting electrode 323c electrically connects to the grounding terminal 324d via the castellation 326. The connecting electrode 323d electrically connects to the output terminal 324c via the castellation 326. The connecting electrode 323b electrically connects to the power source terminal 324b via the castellation 326. The connecting electrode 323b and the connecting electrode 323e are extracted up to the bonding surface 322 and electrically connects to the extraction electrode 332 of the piezoelectric vibrating piece 330. The standby terminal 324a, the power source terminal 324b, and the output terminal 324c are terminals to be electrically connected to an external electrode or similar member. The grounding terminal 324d is a terminal for grounding the piezoelectric device 300.

The integrated circuit element 340 electrically connects to the piezoelectric vibrating piece 330 to form an oscillator circuit. On the surface at the −Y'-axis side of the integrated circuit element 340, the following six terminals are formed. A standby terminal 341a is formed at the −X-axis side and the +Z'-axis side. A piezoelectric terminal 341b is formed at the center of the +Z'-axis side. A grounding terminal 341c is formed at the +X-axis side and the +Z'-axis side. An output terminal 341d is formed at the +X-axis side and the −Z'-axis side. A piezoelectric terminal 341e is formed at the center of the −Z'-axis side. A power source terminal 341f is formed at the −X-axis side and the −Z'-axis side. The standby terminal 341a is a terminal for inputting a signal to set the integrated circuit element 340 in a standby state, which suppresses power consumption, in the integrated circuit element 340. The standby terminal 341a electrically connects to the standby terminal 324a of the base plate 320 via the connecting electrode 323a. The grounding terminal 341c electrically connects to the grounding terminal 324d of the base plate 320 via the connecting electrode 323c. The output terminal 341d electrically connects to the output terminal 324c of the base plate 320 via the connecting electrode 323d. The power source terminal 341f electrically connects to the power source terminal 324b of the base plate 320 via the connecting electrode 323f. The piezoelectric terminal 341b and the piezoelectric terminal 341e electrically connect to the extraction electrodes 332 of the piezoelectric vibrating piece 330 via the connecting electrode 323b and the connecting electrode 323e.

Figure 15A:
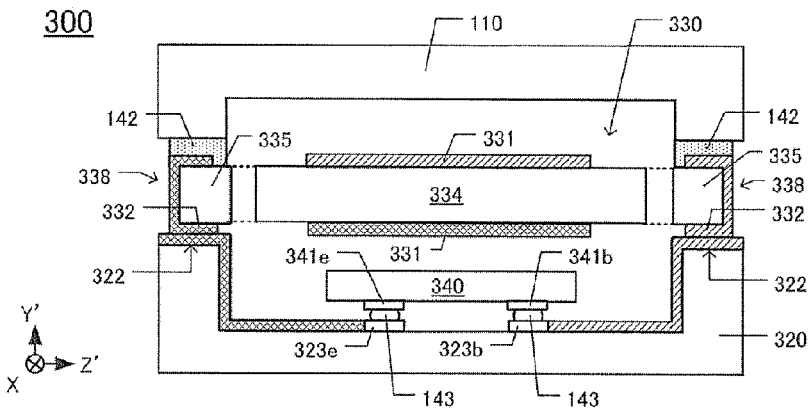
FIG. 15A is a cross-sectional view taken along the line XVA-XVA of FIG. 14.

FIG. 15A is a cross-sectional view taken along the line XVA-XVA of FIG. 14. Each terminal of the integrated circuit element 340 electrically connects to each connecting electrode of the base plate 320 via a metal bump 143. The piezoelectric terminal 341b and the piezoelectric terminal 341e of the integrated circuit element 340 electrically connects to the respective connecting electrode 323b and the connecting electrode 323e. The connecting electrode 323b and the connecting electrode 323e are extracted up to the bonding surfaces 322 at the +Z'-axis side and the −Z'-axis side and electrically connect to the extraction electrodes 332 of the piezoelectric vibrating piece 330 at the bonding surfaces 322. Accordingly, the piezoelectric terminal 341b and the piezoelectric terminal 341e of the integrated circuit element 340 electrically connect to the excitation electrode 331.

Figure 15B:
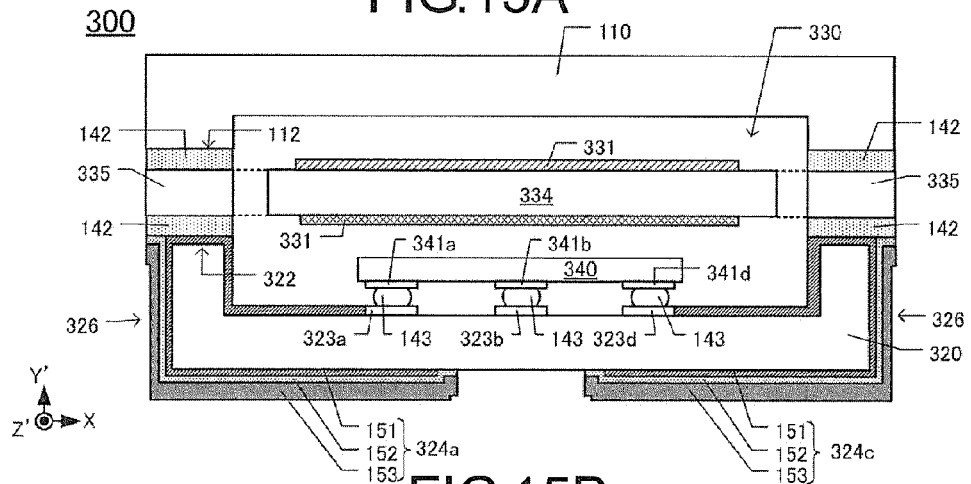
FIG. 15B is a cross-sectional view taken along the line XVB-XVB of FIG. 14.

FIG. 15B is a cross-sectional view taken along the line XVB-XVB of FIG. 14. In the piezoelectric device 300, the bonding surface 112 of the lid plate 110 is bonded to the surface at the +Y'-axis side of the framing portion 335 via the sealing material 142. The bonding surface 322 of the base plate 320 is bonded to the surface at the −Y'-axis side of the framing portion 335 via the sealing material 142. FIG. 15B illustrates a state where the standby terminal 341a of the integrated circuit element 340 electrically connects to the standby terminal 324a of the base plate 320 via the connecting electrode 323a, and the output terminal 341d electrically connects to the output terminal 324c of the base plate 320 via the connecting electrode 323d. The standby terminal 324a, the power source terminal 324b (see FIG. 15C), the output terminal 324c, the grounding terminal 324d (see FIG. 15C), and an electrode formed at the castellation 326, which are formed on the surface at the −Y'-axis side of the base plate 320, are formed by the first metal film 151, the second metal film 152, and the electroless plating film 153. The constitutions of the standby terminal 324a, the power source terminal 324b, the output terminal 324c, and the grounding terminal 324d are similar to the constitution of the hot terminal 124a illustrated in FIG. 2B. The second metal film 152 is formed to cover the first metal film 151, and the electroless plating film 153 is formed on the surface of the second metal film 152.

Figure 15C:
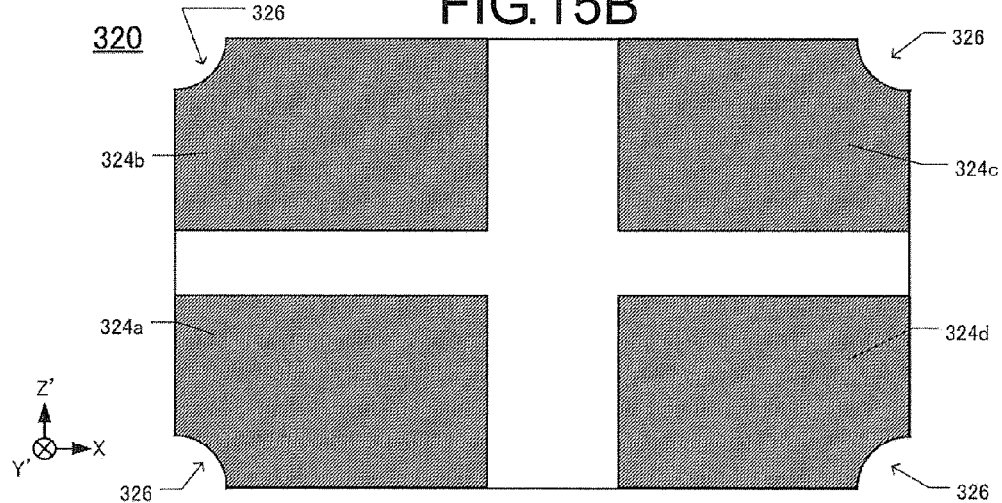
FIG. 15C is a plan view of a surface at the −Y'-axis side of a base plate 320.

FIG. 15C is a plan view of the surface at the −Y'-axis side of the base plate 320. The base plate 320 includes the following terminals on the surface at the −Y'-axis side. The standby terminal 324a is formed at the −X-axis side and the −Z'-axis side. The power source terminal 324b is formed at the −X-axis side and the +Z'-axis side. The output terminal 324c is formed at the +X-axis side and the −Z'-axis side. The grounding terminal 324d is formed at the +X-axis side and the +Z'-axis side. These terminals are mounting terminals to mount the piezoelectric device 300 to a printed circuit board or similar member.

Fabrication Method of the Piezoelectric Device 300

The piezoelectric device 300 can also be fabricated following the flowchart illustrated in FIG. 4. A description will be given of a method for fabricating the piezoelectric device 300.

In step S101, a piezoelectric wafer (not shown) where a plurality of piezoelectric vibrating pieces 330 is formed is prepared. Step S101 is a process for preparing a piezoelectric wafer. Additionally, in step S201, a base wafer (not shown) where a plurality of base plates 320 is formed is prepared. In step S202, the standby terminal 324a, the power source terminal 324b, the output terminal 324c, and the first metal film 151, which constitutes a part of the grounding terminal 324d, of the base plate 320 are formed on the base wafer. Step S201 is a process for preparing a base wafer, and step S202 is a process for forming a first metal film. Furthermore, in step S301, a lid wafer W110 (see FIG. 6) where a plurality of lid plates 110 is formed is prepared. Step S301 is a process for preparing a lid wafer.

Step S401 is a placement process for bonding the base wafer and the piezoelectric wafer. In step S401, first, the integrated circuit element 340 is placed above each depressed portion 321 of the base wafer. Then, the base wafer and the piezoelectric wafer are bonded via the sealing material 142 so as to place the piezoelectric vibrating piece 330 on the base plate 320.

In step S402, the vibration frequency of the vibrator 334 is measured. Step S402 is a vibration frequency checking process. In a piezoelectric device where an integrated circuit element is embedded, a vibration frequency is measured by contacting a probe to the grounding terminal as well. Therefore, in the vibration frequency checking process, a vibration frequency is measured by contacting the probe, for example, to each of three terminals: the grounding terminal 324d, the power source terminal 324b, and the output terminal 324c. In the piezoelectric device 300, the first metal film 151 is formed on the grounding terminal 324d as well in step S202, enabling this kind of measurement.

Step S403 is a bonding process where the lid wafer W110 and the piezoelectric wafer are bonded together. Then, in step S404, the second metal film 152 is formed on the base wafer, and the electroless plating film 153 is formed on the surface of the second metal film 152 in step S405. Furthermore, in step S406, individually divided piezoelectric devices 300 are formed by dicing the base wafer, the lid wafer W110, and the piezoelectric wafer.

Representative embodiments are described in detail above; however, as will be evident to those skilled in the relevant art, this disclosure may be changed or modified in various ways within its technical scope.

For example, the above-described embodiments disclose a case where the piezoelectric vibrating piece is an AT-cut quartz-crystal vibrating piece. A BT-cut quartz-crystal vibrating piece or similar member that similarly vibrates in the thickness-shear mode is similarly applicable. Further, the piezoelectric vibrating piece is basically applicable to a piezoelectric material that includes not only a quartz-crystal material but also lithium tantalite, lithium niobate, and piezoelectric ceramic.

In the above-described embodiments, all mounting terminals may be constituted of the first metal film 151, the second metal film 152, and the electroless plating film 153. That is, the grounding terminal 124b illustrated in FIG. 3A and the grounding terminal 224b illustrated in FIG. 12A may also be constituted of the first metal film 151, the second metal film 152, and the electroless plating film 153 similar to the hot terminal 124a. In this case as well, the first metal film 151 is formed to cover the second metal film 152 as illustrated in FIG. 3B, or the second metal film 152 is formed at a part of the surface of the first metal film 151 as illustrated in FIG. 3C.

Additionally, in the above-described embodiments, a metal film is formed on the entire surface at the +Y'-axis side of the lid plate, and the metal film is electrically connected to the grounding terminal. This enables suppression of a stray capacity of the piezoelectric device and providing a countermeasure against electromagnetic interference.

In the first aspect of the disclosure, the piezoelectric device according to a second aspect is configured as follows. The first metal film and the second metal film include a chromium layer, a nickel tungsten layer, and a gold layer. The nickel tungsten layer is formed on a surface of the chromium layer. The gold layer is formed on a surface of the nickel tungsten layer.

In the first aspect of the disclosure, the piezoelectric device according to a third aspect is configured as follows. The first metal film and the second metal film include a chromium layer, a platinum layer, and a gold layer. The platinum layer is formed on a surface of the chromium layer. The gold layer is formed on a surface of the platinum layer.

In the first aspect to the third aspect of the disclosure, the piezoelectric device according to a fourth aspect is configured as follows. The electroless plating film includes a nickel layer, and the nickel layer has a film thickness of 1 μm to 3 μm.

In the fourth aspect of the disclosure, the piezoelectric device according to a fifth aspect is configured as follows. The electroless plating film includes a gold layer on a surface of the nickel layer.

In the first aspect to the fifth aspect of the disclosure, the piezoelectric device according to a sixth aspect is configured as follows. The mounting terminal includes a pair of grounding terminals and a pair of hot terminals electrically connected to an external electrode. The hot terminal includes the first metal film, the second metal film, and the electroless plating film. The grounding terminal includes the second metal film and the electroless plating film but does not include the first metal film.

In the first aspect to the sixth aspect of the disclosure, the piezoelectric device according to a seventh aspect is configured as follows. The piezoelectric vibrating piece includes the vibrator, a framing portion that surrounds the vibrator, and a connecting portion that connects the vibrator and the framing portion. The base plate and the lid plate are bonded sandwiching the framing portion.

In the first aspect to the seventh aspect of the disclosure, the piezoelectric device according to an eighth aspect is configured as follows. An electronic circuit element is configured to control a vibration of the piezoelectric vibrating piece.

A method for fabricating the piezoelectric device according to a ninth aspect includes preparing a plurality of piezoelectric vibrating pieces, preparing a base wafer, preparing a lid wafer, forming a first metal film, placing the respective piezoelectric vibrating pieces, bonding the lid wafer, forming a second metal film, and forming an electroless plating film. The plurality of piezoelectric vibrating pieces include a pair of excitation electrodes and a pair of extraction electrodes. The pair of extraction electrodes is extracted from the respective excitation electrodes. The base wafer includes a plurality of base plates. The lid wafer includes a plurality of lid plates. The first metal film is constituted by a plurality of metal layers on one principal surface of the respective base plates for a pair of connecting electrodes and on another principal surface of the respective base plates for mounting terminal by sputtering or vacuum evaporation. The piezoelectric vibrating pieces are placed on the respective base plates such that the extraction electrode is electrically connected to the connecting electrode. The lid wafer is bonded on the base wafer to seal the piezoelectric vibrating piece. The second metal film is constituted by a plurality of metal layers similar to the first metal film on another principal surface of the respective base plates for the mounting terminal by sputtering or vacuum evaporation. The electroless plating film is formed on surfaces of the first metal film and the second metal film formed on a surface of the base plate for the mounting terminal by electroless plating. The second metal film has a larger area than the first metal film and is formed to cover the surface of the first metal film or has a smaller area than the first metal film and formed at a part of a surface of the first metal film.

A method for fabricating the piezoelectric device according to a tenth aspect includes preparing a piezoelectric wafer, preparing a base wafer, preparing a lid wafer, forming a first metal film, placing, bonding the lid wafer, forming a second metal film, and forming an electroless plating film. The piezoelectric wafer includes a plurality of piezoelectric vibrating pieces. The piezoelectric vibrating piece includes a vibrator, a framing portion, and a connecting portion. The vibrator forms a pair of excitation electrodes. The framing portion surrounds the vibrator. The connecting portion connects the vibrator and the framing portion. The framing portion includes a pair of extraction electrodes extracted from the pair of excitation electrodes. The base wafer includes a plurality of base plates. The lid wafer includes a plurality of lid plates. The first metal film is constituted by a plurality of metal layers on one principal surface of the respective base plates for a pair of connecting electrodes and on another principal surface for mounting terminal by sputtering or vacuum evaporation. The base wafer and the piezoelectric wafer are bonded together such that the extraction electrode is electrically connected to the connecting electrode of the respective base plates and each of the piezoelectric vibrating pieces are placed on each of the respective base plates. The lid wafer is bonded on the piezoelectric wafer to seal the vibrator. The second metal film is constituted by a plurality of metal layers similar to the first metal film on another principal surface of the respective base plates for the mounting terminal by sputtering or vacuum evaporation. The electroless plating film is formed on surfaces of the first metal film and the second metal film formed on a surface of the base plate for the mounting terminal by electroless plating. The second metal film has a larger area than the first metal film and is formed to cover the surface of the first metal film or has a smaller area than the first metal film and formed at a part of a surface of the first metal film.

In the ninth aspect and the tenth aspect of the disclosure, the method for fabricating the piezoelectric device according to an eleventh aspect is configured as follows. The electroless plating film includes a nickel layer. The nickel layer is formed at a deposition rate of 5 µm/hour to 15 µm/hour.

In the ninth aspect to the eleventh aspect of the disclosure, the method for fabricating the piezoelectric device according to a twelfth aspect is configured as follows. The mounting terminal includes a grounding terminal and a hot terminal to be electrically connected to an external electrode. The forming first metal film forms the first metal film at the mounting terminal for the hot terminal only. The forming second metal film forms the second metal film at the mounting terminal for the grounding terminal and the hot terminal.

In the ninth aspect to the twelfth aspect of the disclosure, the method for fabricating the piezoelectric device according to a thirteenth aspect is configured as follows. The placing places an electronic circuit element that controls a vibration of the piezoelectric vibrating piece on each of the base plates.

In the ninth aspect to the twelfth aspect of the disclosure, the method for fabricating the piezoelectric device according to a fourteenth aspect is configured as follows. A vibration frequency of the piezoelectric vibrating piece is checked after the placing and before the bonding.

With the piezoelectric device and the method for fabricating the piezoelectric device according to the embodiments, detachment of an electrode formed by electroless plating can be avoided.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A surface mount type piezoelectric device, comprising:
a piezoelectric vibrating piece that includes a vibrator with a pair of excitation electrodes and an extraction electrode extracted from the pair of excitation electrodes, the vibrator vibrating at a predetermined vibration frequency;
a base plate that includes one principal surface and another principal surface, the piezoelectric vibrating piece being placed on the one principal surface, a connecting electrode is formed on the one principal surface and being electrically connected to the extraction electrode, a mounting terminal is formed on the another principal surface; and
a lid plate that seals the vibrator, wherein
at least a part of the mounting terminal includes a first metal film, a second metal film, and an electroless plating film,
the first metal film includes a plurality of laminated metal layers formed by sputtering or vacuum evaporation,
the second metal film includes a plurality of laminated metal layers, the second metal film being formed to cover the first metal film or being formed at a part of a surface of the first metal film, the second metal film having a different area from the first metal film, and the electroless plating film being formed at least on a surface of the second metal film by electroless plating, wherein the first metal film and the second metal film include a chromium layer, a nickel tungsten layer, and a gold layer, the nickel tungsten layer is formed on a surface of the chromium layer, and the gold layer is formed on a surface of the nickel tungsten layer.

2. The piezoelectric device according to claim 1, wherein the electroless plating film includes a nickel layer, and the nickel layer has a film thickness of 1 μm to 3 μm.

3. The piezoelectric device according to claim 2, wherein the electroless plating film including a gold layer on a surface of the nickel layer.

4. The piezoelectric device according to claim 1, wherein the mounting terminal includes a pair of grounding terminals and a pair of hot terminals electrically connected to an external electrode, the hot terminal includes the first metal film, the second metal film, and the electroless plating film, and the grounding terminal includes the second metal film and the electroless plating film but does not include the first metal film.

5. The piezoelectric device according to claim 1, wherein the piezoelectric vibrating piece includes the vibrator, a framing portion that surrounds the vibrator, and a connecting portion that connects the vibrator and the framing portion, and the base plate and the lid plate are bonded sandwiching the framing portion.

6. The piezoelectric device according to claim 1, further comprising:

an electronic circuit element configured to control a vibration of the piezoelectric vibrating piece.

* * * * *